United States Patent
Totsuka et al.

(10) Patent No.: US 9,826,186 B2
(45) Date of Patent: Nov. 21, 2017

(54) IMAGING APPARATUS AND IMAGING SYSTEM

(71) Applicant: CANON KABUSHIKI KAISHA, Tokyo (JP)

(72) Inventors: Hirofumi Totsuka, Fujisawa (JP); Daisuke Yoshida, Ebina (JP); Shinya Nakano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/208,380

(22) Filed: Jul. 12, 2016

(65) Prior Publication Data
US 2017/0019621 A1    Jan. 19, 2017

(30) Foreign Application Priority Data

Jul. 16, 2015 (JP) ................................. 2015-142507
Mar. 3, 2016 (JP) ................................. 2016-041580

(51) Int. Cl.
*H04N 5/378* (2011.01)
*H01L 27/146* (2006.01)
*H04N 5/357* (2011.01)

(52) U.S. Cl.
CPC ....... *H04N 5/378* (2013.01); *H01L 27/14609* (2013.01); *H01L 27/14643* (2013.01); *H04N 5/3575* (2013.01)

(58) Field of Classification Search
CPC . H04N 5/378; H04N 5/3575; H01L 27/14609
See application file for complete search history.

(56) References Cited

U.S. PATENT DOCUMENTS

2010/0103017 A1    4/2010  Sakurai
2014/0313385 A1*  10/2014  Sato ....................... H04N 5/378
                                                                 348/302

FOREIGN PATENT DOCUMENTS

| EP | 1151601 A1 | 11/2001 |
|---|---|---|
| JP | 2008042885 A | 2/2008 |
| JP | 2008067357 A | 3/2008 |
| JP | 2010103913 A | 5/2010 |
| JP | 2013051497 A | 3/2013 |

* cited by examiner

*Primary Examiner* — Christopher K Peterson
(74) *Attorney, Agent, or Firm* — Canon U.S.A., Inc. IP Division

(57) ABSTRACT

An imaging apparatus is provided which, in a case where an optical signal is smaller than a threshold, performs more AD conversions for generating digital signals than the number of times of AD conversions in a case where an optical signal is larger than the threshold.

20 Claims, 10 Drawing Sheets

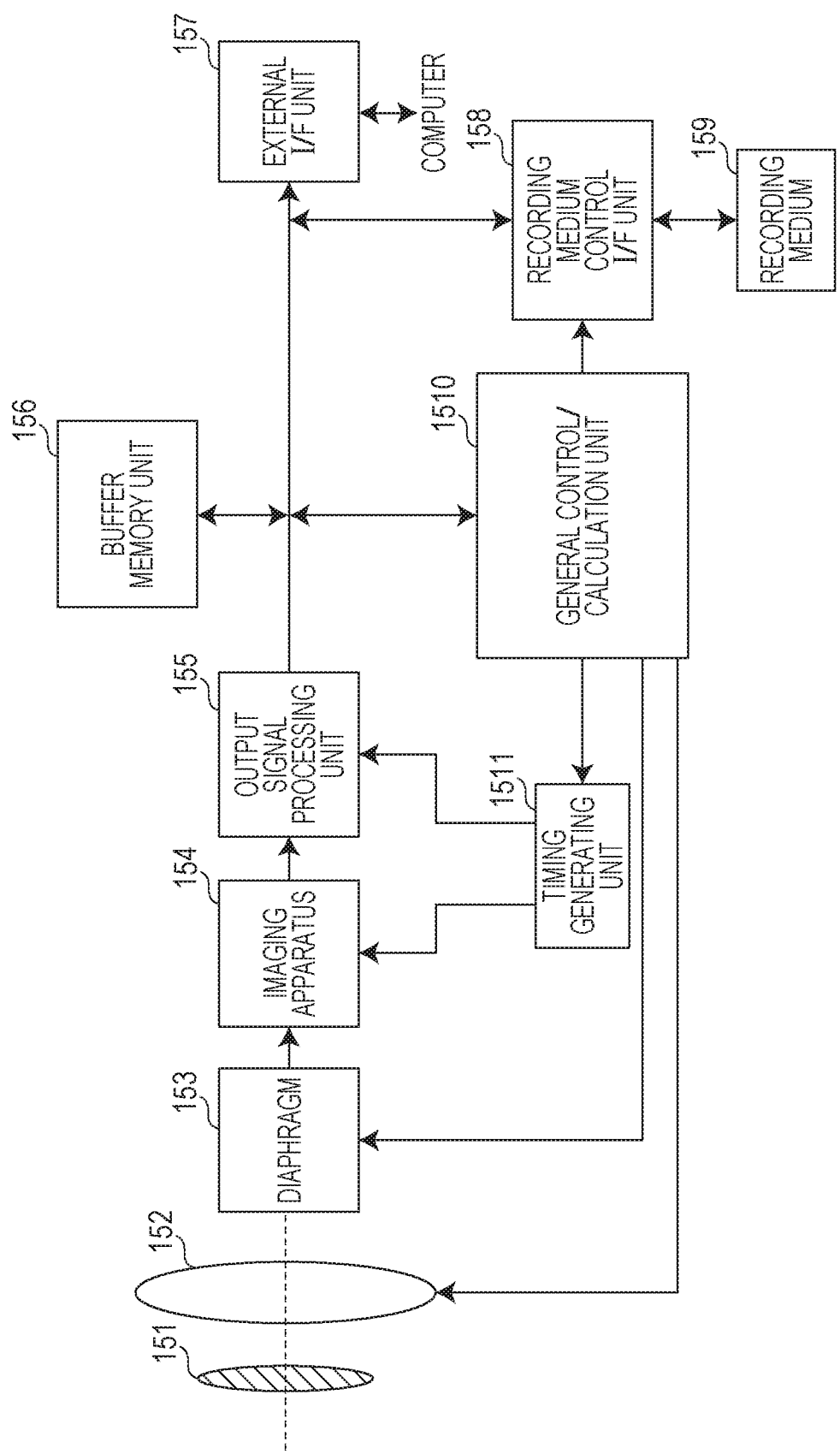

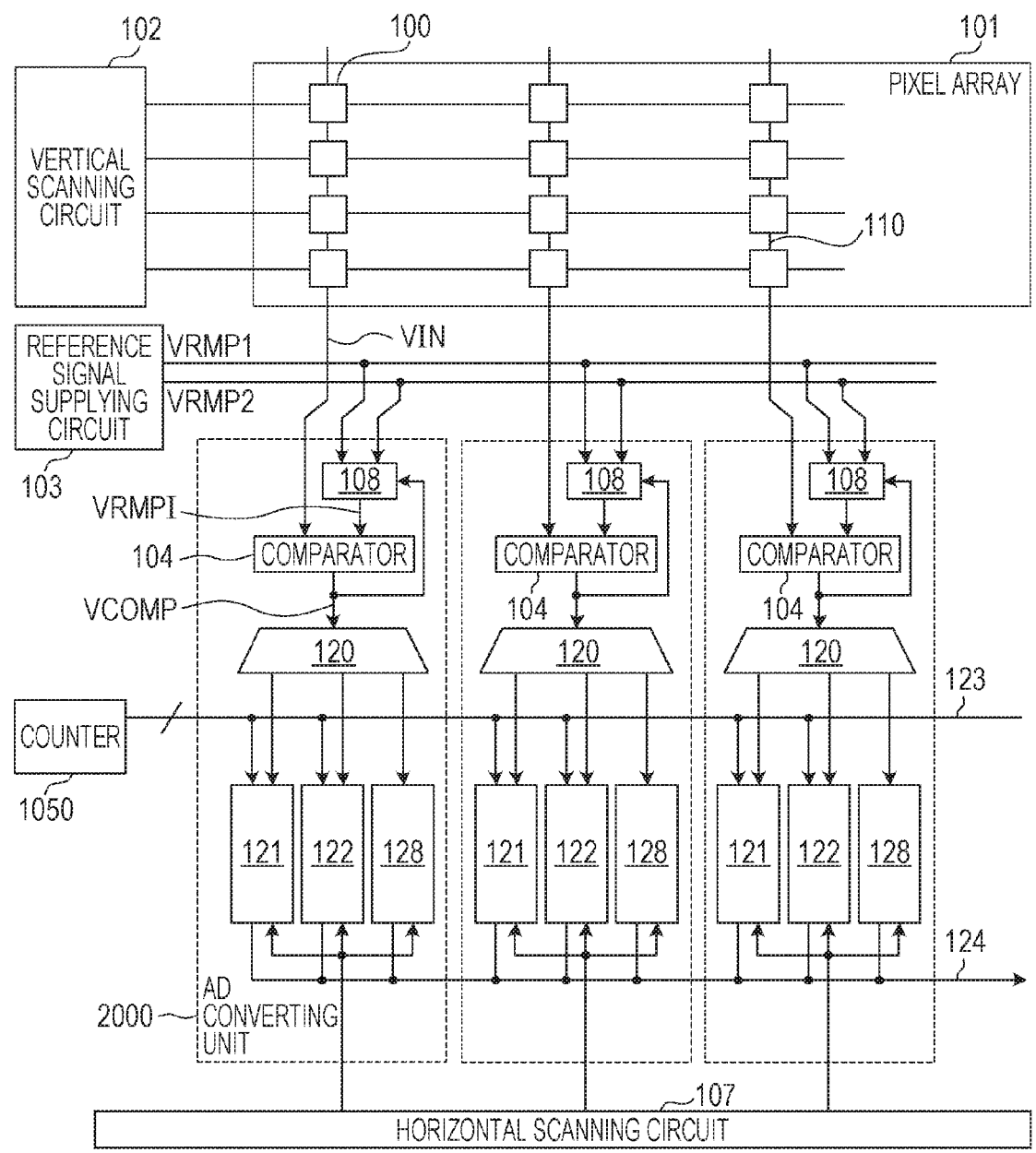

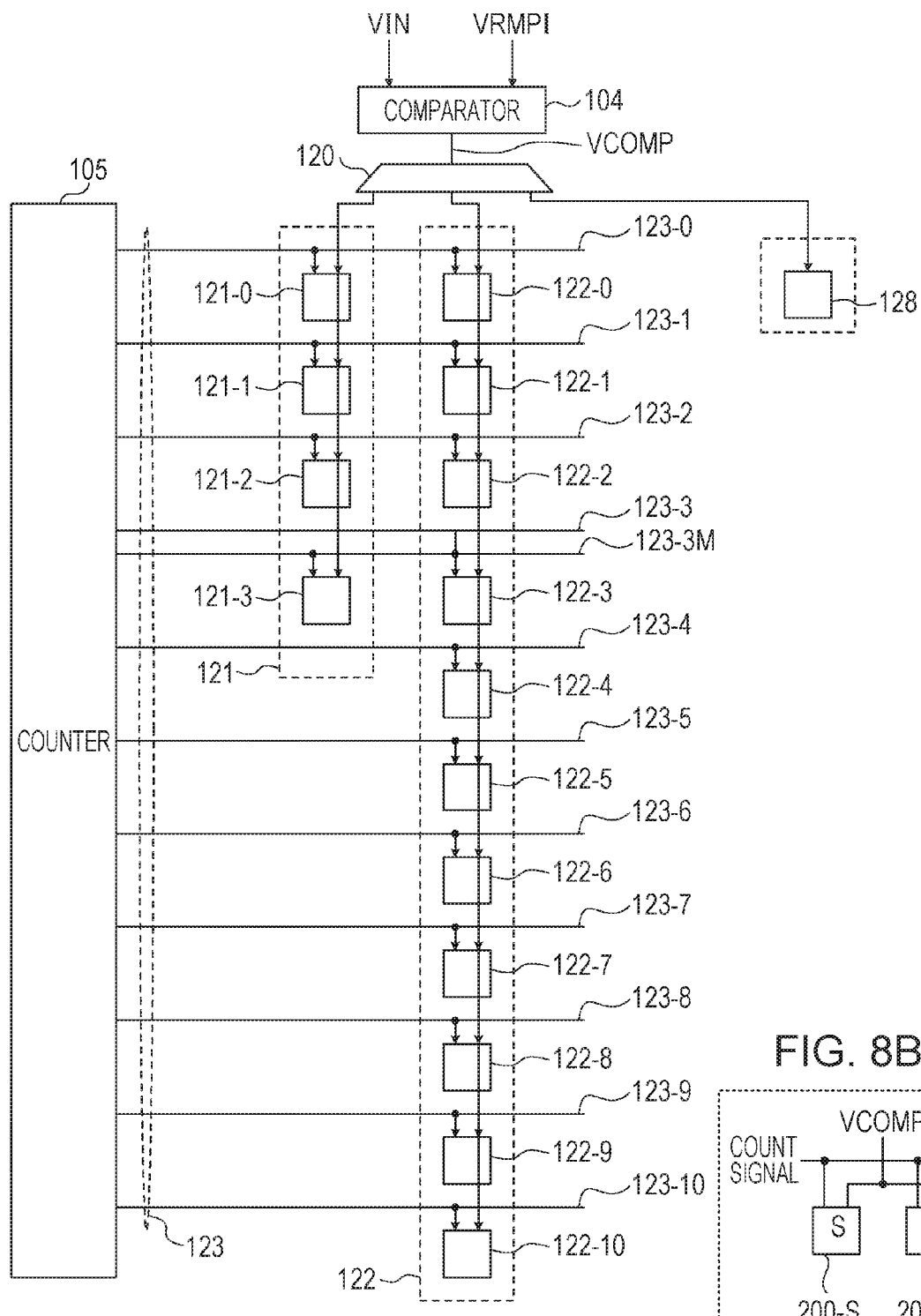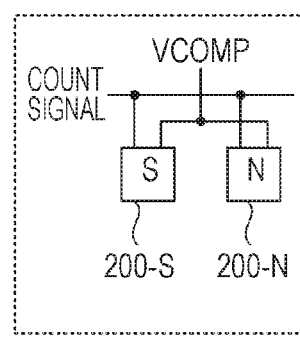

IMAGING APPARATUS AND IMAGING SYSTEM

BACKGROUND OF THE INVENTION

Field of the Invention

The present invention relates to an imaging apparatus and an imaging system.

Description of the Related Art

An imaging apparatus has been known which has AD converting units configured to AD convert signals output from pixels.

Japanese Patent Laid-Open No. 2010-103913 discloses a technology which performs a plurality of AD conversions on one signal output from a pixel by repetitively using ramp signals having an equal amplitude and an equal gradient from a ramp starting potential to a ramp end potential. The lengths of the periods in which the plurality of AD conversions are performed are equal to each other. According to Japanese Patent Laid-Open No. 2010-103913, the technology can provide an imaging apparatus having an improved noise characteristic.

SUMMARY OF THE INVENTION

The present invention was made in view of some challenges encountered with the previous technology. An aspect of the present invention provides an imaging apparatus comprising pixels configured to output optical signals, an AD converting unit, a reference signal supplying unit configured to supply a ramp signal to the AD converting unit, and a counter configured to generate a count signal by counting clock signals, wherein the AD converting unit performs a first comparison being a comparison between a ramp signal and the optical signal, the ramp signal having a signal level changing in a first amplitude range at a first changing rate depending on elapsed time, in a case where the magnitude relationship between the ramp signal and the optical signal is changed in the first comparison, the AD converting unit generates a first digital signal by acquiring the count signal corresponding to a change from start of the first comparison to the change of the magnitude relationship between the ramp signal and the optical signal, and generates a second digital signal by performing a second comparison being a comparison between a ramp signal and the optical signal, the ramp signal having a signal level changing in a second amplitude range at a second changing rate depending on elapsed time, in a case where the magnitude relationship between the ramp signal and the optical signal is not changed in the first comparison, the AD converting unit generates a third digital signal by performing a third comparison being a comparison between a ramp signal and the optical signal, the ramp signal having signal level changing in a third amplitude range larger than the first amplitude range at a third changing rate depending on elapsed time larger than both of the first changing rate and the second changing rate.

Another aspect of the present invention provides an imaging apparatus comprising pixels each configured to generate an optical signal by performing photoelectric conversion on light and output the optical signal, an AD converting unit, a reference signal supplying unit configured to supply a ramp signal to the AD converting unit, a counter configured to generate a count signal by counting clock signals, and an amplifying unit configured to output to the AD converting unit an amplified signal being a signal acquired by amplifying the optical signal by a predetermined amplification factor, wherein the AD converting unit performs a first comparison being a comparison between the ramp signal and a first amplified signal having undergone amplification by a first amplification factor in the amplifying unit, in a case where the magnitude relationship between the ramp signal and the first amplified signal is changed in the first comparison, the AD converting unit generates a first digital signal by acquiring the count signal corresponding to a period from start of the first comparison to the change of the magnitude relationship between the ramp signal and the first amplified signal and generates a second digital signal by performing a second comparison being a comparison between the ramp signal and the first amplified signal, and in a case where the magnitude relationship between the ramp signal and the first amplified signal is not changed in the first comparison, the AD converting unit generates a third digital signal by performing a third comparison being a comparison between the ramp signal and a second amplified signal having undergone amplification by a second amplification factor smaller than the first amplification factor in the amplifying unit.

Further features of the present invention will become apparent from the following description of exemplary embodiments with reference to the attached drawings.

BRIEF DESCRIPTION OF THE DRAWINGS

FIG. 6 illustrates an example of a configuration of an imaging system.

FIG. 7 illustrates an example of a configuration of an imaging apparatus.

FIG. 8 (comprising FIG. 8A and FIG. 8B) illustrates an example of a configuration of an AD converting unit.

DESCRIPTION OF THE EMBODIMENTS

In an imaging apparatus disclosed in Japanese Patent Laid-Open No. 2010-103913, ramp signals having an identical amplitude and an identical gradient from a ramp starting potential to a ramp end potential are repetitively used to perform a plurality of AD conversions irrespective of amplitudes of signals of pixels. This may require long time for performing the plurality of AD conversions in a case where the amplitude of the ramp signal is set so as to include all of the possible range of the amplitudes of signals of pixels, for example. On the other hand, setting the amplitude of the ramp signal so as to only partially include the possible range of the amplitude of signals of pixels may reduce the range of signals of pixels on which AD conversions can be performed and may thus reduce the dynamic range. The imaging apparatus disclosed in Japanese Patent Laid-Open No. 2010-103913 may not properly consider the balance between the length of the period required for the AD conversions and the width of the dynamic range.

Exemplary embodiments will be described below with reference to drawings. Expressions "a/the amplitude is large" and "a/the amplitude is small" are used for describing the height of a signal level in the following descriptions. The term "amplitude" represents the amount of change from a reference signal value. For example, there may be a case where a signal A may have an electric potential (such as 0 V) numerically smaller than the electric potential (such as 1 V) of a signal B. In this case, if a reference signal level (such as 3 V) for electric potentials of the signal A and the signal B is larger than a medium electric potential between those of the signal A and the signal B, it is expressed as "the amplitude of the signal A is larger than the amplitude of the signal B".

First Exemplary Embodiment

Figure 1A:
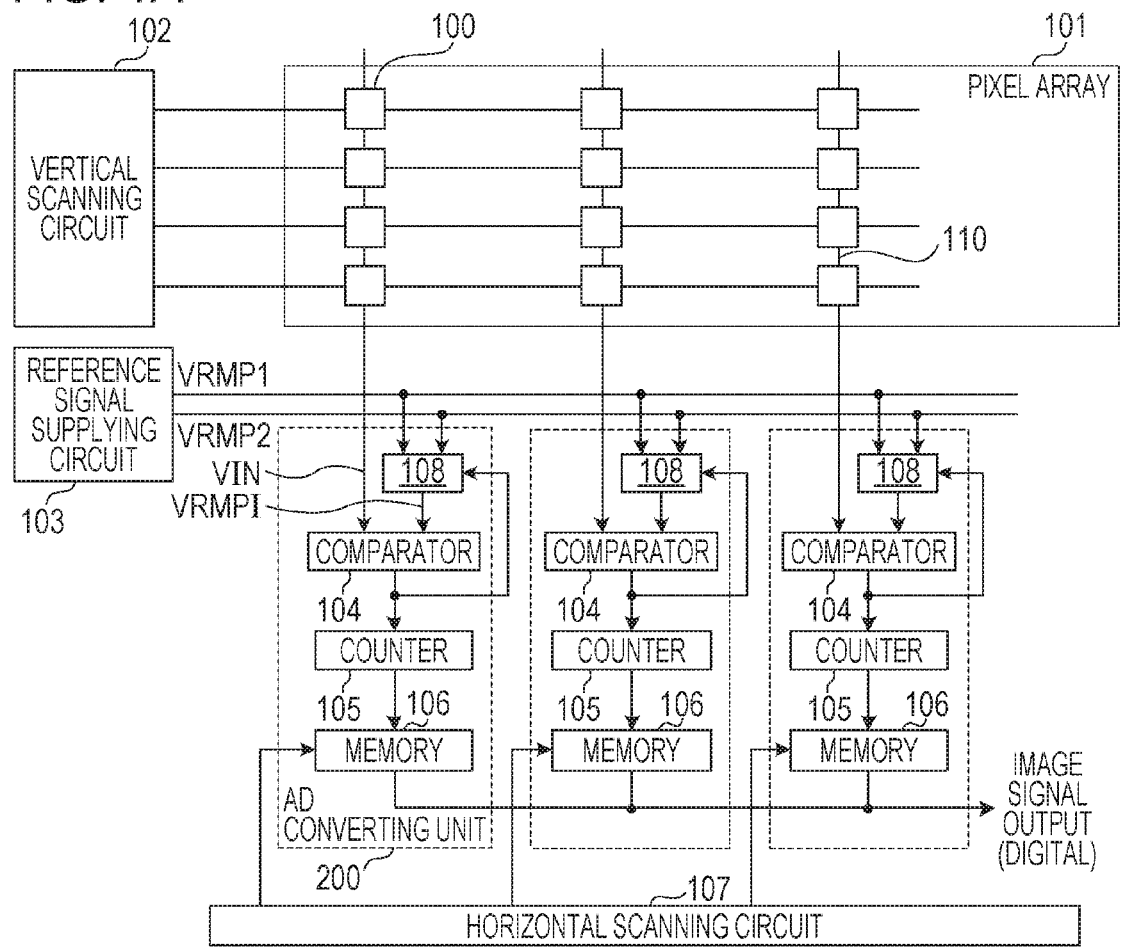
FIG. 1A illustrates an example of a configuration of an imaging apparatus.

FIG. 1A illustrates an imaging apparatus according to a first exemplary embodiment.

A pixel array 101 has a plurality of pixels 100 arranged over a plurality of rows and a plurality of columns. A vertical scanning circuit 102 is configured to perform vertical scanning which sequentially scans the plurality of pixels 100 in the pixel array 101 row by row. The plurality of pixels 100 of each row is electrically connected to the vertical scanning circuit 102 through a control signal line. The plurality of pixels 100 of each column is electrically connected to a vertical signal line 110. The vertical signal line 110 of each column is provided for each column of the plurality of pixels 100. The vertical signal line 110 is electrically connected to a comparator 104 provided externally to the pixel array 101. Signals output from the pixels 100 through the vertical signal line 110 are input to the corresponding comparator 104. A signal to be input to the comparator 104 will be called a signal VIN, hereinafter. Each of the comparators 104 is electrically connected to a selecting circuit 108. A ramp signal VRMP1 and a ramp signal VRMP2 are supplied from a reference signal supplying circuit 103 to the selecting circuit 108. The selecting circuit 108 selects one ramp signal of the ramp signal VRMP1 and the ramp signal VRMP2 and outputs the selected one to the corresponding comparator 104. A ramp signal to be output from the selecting circuit 108 to the corresponding comparator 104 will be called a ramp signal VRMPI. Each of the ramp signal VRMP1 and the ramp signal VRMP2 is a signal having a signal level that changes depending on elapsed time at a predetermined changing rate. According to this exemplary embodiment, the changing rate of signal level of the ramp signal VRMP1 is ¼ times of the changing rate of signal level of the ramp signal VRMP2.

The reference signal supplying circuit 103 is a reference signal supplying unit configured to supply the ramp signal VRMP1 and the ramp signal VRMP2.

The comparator 104 of each column is electrically connected to one counter 105. Clock signals are input from a timing generator, not illustrated, to the counter 105. The counter 105 is configured to generate a count signal as a result of counting of the clock signals.

The counter 105 of each column is electrically connected to one memory 106. The memory 106 of each column holds a count signal generated by the corresponding counter 105.

One analog-to-digital (AD) converting unit 200 has one comparator 104 and one counter 105, and one memory 106. The one AD converting unit 200 is provided for each column of the plurality of pixels 100.

A horizontal scanning circuit 107 performs horizontal scanning which sequentially scans the memories 106 of columns. Thus, count signals (image signals) held in the memories 106 of the columns are output.

Figure 1B:
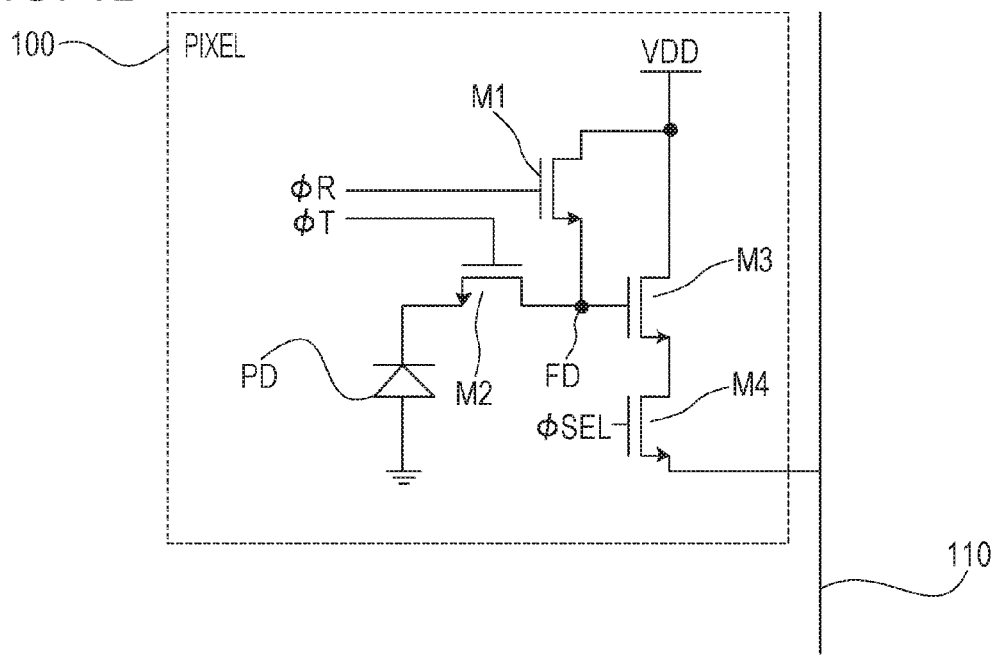
FIG. 1B illustrates an example of a configuration of a pixel.

FIG. 1B illustrates a configuration of one of the pixels 100. The pixel 100 has a photodiode PD, a reset transistor M1, a transfer transistor M2, a amplify transistor M3, and a select transistor M4. The reset transistor M1 has a control node which receives a signal φR input from the vertical scanning circuit 102. The transfer transistor M2 has a control node which receives a signal φT input from the vertical scanning circuit 102. The select transistor M4 has an input node which receives a signal φSEL input from the vertical scanning circuit 102. Power supply voltage VDD is input to one main node of the reset transistor M1 and one main node of the amplify transistor M3. The other main node of the reset transistor M1, one main node of the transfer transistor M2 and the control node of the amplify transistor M3 are electrically connected to a node FD. The other main node of the transfer transistor M2 is electrically connected to the photodiode PD.

The other main node of the amplify transistor M3 is electrically connected to one main node of the select transistor M4. The other main node of the select transistor M4 is electrically connected to the vertical signal line 110. The amplify transistor M3, a current source, not illustrated, electrically connected to the vertical signal line 110, and the power supply voltage VDD configure a source follower circuit.

Figure 2A:
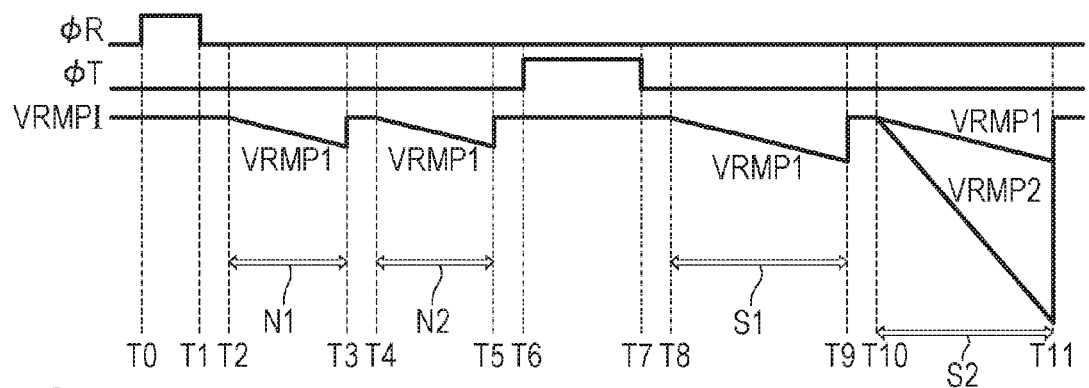
FIG. 2A illustrates an example of operations of an imaging apparatus.
Figure 2B:
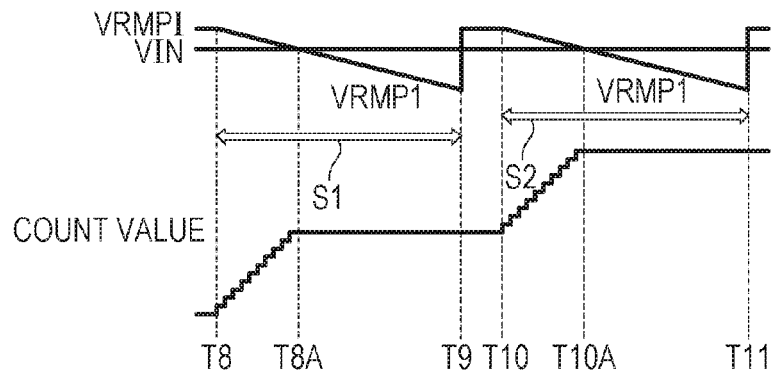
FIG. 2B illustrates an example of operations of an imaging apparatus.
Figure 2C:
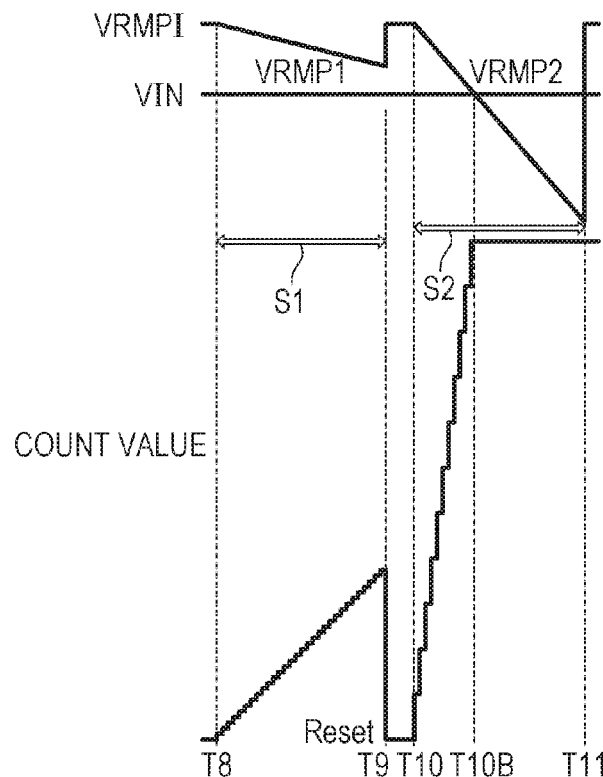
FIG. 2C illustrates an example of operations of an imaging apparatus.

FIGS. 2A to 2C illustrate operations of the imaging apparatus illustrated in FIG. 1A. FIGS. 2A to 2C illustrate operations of the pixels 100 of one row of the pixels 100 of the plurality of rows illustrated in FIG. 1A. Though FIGS. 2A to 2C do not illustrate the signal φSEL, the vertical scanning circuit 102 outputs a signal φSEL having High level (hereinafter, called Hi) as its signal level to the select transistors M4 of the pixels 100 of one row from a time T0 to a time T11. Thus, from the time T0 to the time T11, the select transistors M4 have an ON state.

Signals φR and φT illustrated in FIGS. 2A to 2C correspond to the signals illustrated in FIG. 1B. The ramp signals VRMPI illustrated in FIGS. 2A to 2C are ramp signals output from the selecting circuit 108 to the comparator 104 as described above.

In a period before the time T0, the vertical scanning circuit 102 outputs the signals φR and φT having a signal level of a tow level (hereinafter, called Lo). Thus, the reset transistor M1 and the transfer transistor M2 receiving the signals φR and φT have an OFF state.

At the time T0, the vertical scanning circuit 102 changes the signal φR to have Hi. Thus, reset transistor M1 is changed to have an ON state. Because of the reset transistor M1 changed to the ON state, the node FD is reset to a signal level based on the power supply voltage VDD.

At the time T1, the vertical scanning circuit 102 changes the signal ϕR to Lo. Thus, the reset transistor M1 is turned off. Thus, the reset of the node FD is cancelled. The amplify transistor M3 outputs a signal based on the signal level of the node FD in which the reset has been cancelled. This signal will be called an N signal.

From a time T2, the reference signal supplying circuit 103 starts change of the signal level of the ramp signal VRMP1 depending on elapsed time. The reference signal supplying circuit 103 does not change the signal level of the ramp signal VRMP2. The selecting circuits 108 of all columns output the ramp signals VRMP1 as ramp signals VRMPI to the respective comparators 104. Each of the comparators 104 compares the ramp signal VRMP1 and the N signal output to the vertical signal line 110. The comparator 104 outputs to the counter 105 a comparison result signal representing a result of a comparison between signal levels of signals output to the ramp signal VRMP1 and the vertical signal line 110.

The counter 105 starts counting of clock signals at the time T2. Thus, the signal values of the count signals generated by the counter 105 increases depending on elapsed time.

In a period from the time T2 to a time T3, the magnitude relationship between the signal levels of the ramp signal VRMP1 and the N signal is changed. At this time point, the signal value of a comparison result signal output by the comparator 104 changes. The counter 105 holds the count signal at the time point when the signal value of the comparison result signal has changed. The count signal will be called a first N digital signal.

At the time T3, the reference signal supplying circuit 103 finishes changing of the signal level of the ramp signal VRMP1 depending on elapsed time and resets the ramp signal VRMP1 to have an initial value.

The period from the time T2 to the time T3 will be called a first N conversion period N1. The first N conversion period N1 is an analog-to-digital (AD) conversion period in which the first N digital signal is generated.

At a time T4, the reference signal supplying circuit 103 restarts changing the signal level of the ramp signal VRMP1 depending on elapsed time. Also at this time point, the reference signal supplying circuit 103 does not change the signal level of the ramp signal VRMP2. The selecting circuits 108 of all columns output the ramp signals VRMP1 as ramp signals VRMPI to the respective comparators 104. The counter 105 starts counting clock signals from the signal value of the first N digital signal that it holds.

In a period from the time T4 to a time T5, the signal value of the comparison result signal changes again. The counter 105 holds the count signal at the time point when the signal value of the comparison result signal has changed. The count signal will be called a second N digital signal.

The period from the time T4 to the time T5 will be called a second N conversion period N2. The second N conversion period N2 is analog-to-digital (AD) conversion period in which the second N digital signal is generated. The second N conversion period N2 has an equal length to that of the first N conversion period N1. In the first N conversion period N1 and the second N conversion period N2, the comparator 104 performs a fourth comparison which compares a ramp signal changing the signal level at a first changing rate depending elapsed time within a first amplitude range and a noise signal. First to third comparisons compare the ramp signal and an optical signal, which will be described below.

A second N digital signal generated as a result of a plurality of fourth comparisons is a fourth digital signal. First to third digital signals are digital signals generated as a result of comparisons between the ramp signal and an optical signal, which will be described below.

The memory 106 holds the second N digital signal held in the counter 105. The counter 105 resets the signal value of the count signal to an initial value.

The horizontal scanning circuit 107 performs horizontal scanning to cause the memories 106 of the columns to sequentially output the second N digital signals held in the memories 106 of the columns.

At a time T6, the vertical scanning circuit 102 changes the signal ϕT to Hi. This turns on the transfer transistor M2. Thus, transfer of electric carriers accumulated in the photodiode PD to the node FD through the transfer transistor M2 is started.

At a time T7, the vertical scanning circuit 102 changes the signal ϕT to Lo. This turns off the transfer transistor M2. Thus, the transfer of electric carriers from the photodiode PD to the node FD ends.

The amplify transistor M3 outputs a signal based on the signal level of the node FD to the vertical signal line 110 through the select transistor M4. The signal output from the amplify transistor M3 to the vertical signal line 110 will be called an S signal. The S signal is an optical signal generated and output by a pixel through a photoelectric conversion.

At a time T8, the reference signal supplying circuit 103 starts change of the signal level of the ramp signal VRMP1 depending on elapsed time. Here, the reference signal supplying circuit 103 does not change the signal level of the ramp signal VRMP2. The selecting circuits 108 of all columns output the ramp signals VRMP1 as ramp signals VRMPI to the respective comparators 104. The comparator 104 compares between signal levels of the S signal output to the vertical signal line 110 and the ramp signal VRMP1. At the time T8, the counter 105 starts counting clock signals from the initial value.

A case where the S signal has an amplitude equal to or smaller than the amplitude of the ramp signal VRMP1 at a time T9 and a case where the S signal has an amplitude larger than the amplitude of the ramp signal VRMP1 at the time T9 will be described below separately from each other.

FIG. 2B illustrates a case where the S signal has an amplitude equal to or smaller than the amplitude of the ramp signal VRMP1 at the time T9. The times T8, T9, T10, and T11 in FIG. 2B correspond to the times illustrated in FIG. 2A.

In a period from the time T8 to the time T9, in a case where the S signal has an amplitude smaller than the amplitude of the ramp signal VRMP1 at the time T9, the magnitude relationship between signal levels of the ramp signal VRMP1 and the S signal may be changed at a time T8A, for example. In this case, the change of the magnitude relationship changes the signal value of the comparison result signal. The counter 105 holds the count signal at a time point when the signal value of the comparison result signal has changed. The count signal will be called a first S digital signal. The change of the signal value of the comparison result signal at the time T8A is also output to the selecting circuit 108. The selecting circuit 108 in response to the change of the signal value of the comparison result signal changes the ramp signal VRMPI to be supplied to the comparator 104 at and after the time T10 to the ramp signal VRMP1. According to this exemplary embodiment, a first changing rate depending on elapsed time being a changing rate of the ramp signal VRMPI to be used for AD conversion in a first S conversion period S1 is equal to a second changing rate depending on elapsed time being a changing rate of the ramp signal VRMPI to be used for AD conversion in a second S conversion period S2.

At the time T9, the reference signal supplying circuit 103 finishes changing of the signal level of the ramp signal VRMP1 depending on elapsed time and resets the ramp signal VRMP1 to have an initial value.

The period from the time T8 to the time T9 is the first S conversion period S1. The first S conversion period S1 is a first period in which an optical signal and a ramp signal having the first changing rate depending on elapsed time are compared. In operations in FIG. 2B, during the first period, the comparator 104 performs a first comparison which compares a ramp signal changing the signal level at a first changing rate depending on elapsed time within a first amplitude range and an optical signal. The first S digital signal generated as a result of the first comparison is a first digital signal.

During the period from the time T9 to the time T10, the selecting circuit 108 selects one of the ramp signal VRMP1 and ramp signal VRMP2 as the ramp signal VRMPI. As described above, in the operations in FIG. 2B, the selecting circuit 108 selects the ramp signal VRMP1 as the ramp signal VRMPI in response to the change of the signal value of the comparison result signal at the time T8A.

At the time T10, the reference signal supplying circuit 103 restarts the changing of the signal level of the ramp signal VRMP1 depending on elapsed time. The changing rate of the signal level of the ramp signal VRMP1 per unit time is equal to the changing rate of the signal level of the ramp signal VRMP1 per unit time in the period from the time T8 to the time T9. In other words, the changing rate depending on elapsed time of the signal level of a ramp signal changing its potential in a period from the time T10 to a time T11 is also equal to the first changing rate depending on elapsed time. The counter 105 starts counting clock signals from the signal value of the first S digital signal that it holds.

During the period from the time T10 to the time T11, such as at a time T10A, the signal value of the comparison result signal changes again. The counter 105 holds the count signal at the time point when the signal value of the comparison result signal has changed. This count signal will be called a second S digital signal.

The period from the time T10 to the time T11 is the second S conversion period S2. The second S conversion period S2 has a length equal to that of the first S conversion period S1. The second S conversion period S2 is a second period in which an optical signal and a ramp signal having the first changing rate depending on elapsed time are compared. The second S conversion period S2 is a period having a length equal to that of the first S conversion period S1. The ramp signal in the second period has a maximum amplitude (of the signal level at the time T11) equal to a maximum amplitude (of the signal level at the time T9) of the ramp signal in the first period. In operations in FIG. 2B, during the second period, the comparator 104 performs a second comparison which compares a ramp signal changing the signal level at a second changing rate depending on elapsed time within a second amplitude range and an optical signal. The second S digital signal generated as a result of the second comparison is a second digital signal.

The memory 106 holds the second S digital signal held in the counter 105. The counter 105 resets the signal value of the count signal to an initial value.

The horizontal scanning circuit 107 performs horizontal scanning to cause the memories 106 of the columns to sequentially output the second S digital signals held in the memories 106 of the columns.

FIG. 2C illustrates a case where the S signal has an amplitude larger than the amplitude of the ramp signal VRMP1 at the time T9. The times T8, T9, T10, and T11 correspond to the respective times illustrated in FIG. 2A.

In a case where the S signal has an amplitude larger than the amplitude of the ramp signal VRMP1 at the time T9, in the period from the time T8 to the time T9, the signal value of the comparison result signal does not change. In this case, the counter 105 finishes the counting of the clock signal at the time T9 and resets the signal value of the count signal to an initial value. The selecting circuit 108 in response to no change of the signal value of the comparison result signal in the period from the time T8 to the time T9 selects the ramp signal VRMP2 as a ramp signal VRMPI to be supplied to the comparator 104 at and subsequent to a time T10. According to this exemplary embodiment, a third changing rate depending on elapsed time being a changing rate of the ramp signal VRMPI to be used for AD conversion of the second S conversion period S2 is larger than the first changing rate being a changing rate of signal level of the ramp signal VRMPI used for AD conversion of the first S conversion period S1.

At the time T9, the reference signal supplying circuit 103 restarts the changing of the signal level of the ramp signal VRMP depending on elapsed time. The counter 105 starts counting clock signals from the initial value. In the case illustrated in FIG. 2O, eight times count up (3 bit shift) of the case illustrated in FIG. 2B is performed. One reason for performing the 8× count up is that the changing rate depending on elapsed time of the ramp signal VRMP2 is four times the changing rate depending on elapsed time of the ramp signal VRMP1. Another reason is that the second S digital signal generated by the operations in FIG. 2B is a signal acquired by adding results of two AD conversions while the digital signal generated by the operations in FIG. 2C is acquired by performing the operation of one AD conversion. Therefore, in order to acquire an equal AD conversion gain between the second S digital signal generated by the operations in FIG. 2B and the digital signal generated by the operations in FIG. 2O, the counter 105 performs count-ups eight times (=four times by two times) the counting operation performed in the operations in FIG. 2B.

During the period from the time T10 to the time T11, such as at a time T10B, the signal value of the comparison result signal changes. The counter 105 holds the count signal at the time point when the signal value of the comparison result signal has changed. The count signal will be called a third S digital signal. The third S digital signal is a signal acquired by counting the period from the time T10 to the time T10B only while the second S digital signal is a signal acquired by adding and counting the period from the time T8 to the time T8A and the period from the time T10 to the time T10A. The third S digital signal is a digital signal generated by one comparison operation performed by the comparator 104. On the other hand, the second S digital signal is a digital signal acquired by adding digital signals generated by a plurality of comparison operations performed by the comparator 104. The counter 105 is an adding unit configured to generate a digital signal by adding digital signals generated by a plurality of AD conversions. In the operations in FIG. 2C, at a second period, the comparator 104 performs a third comparison which is a comparison between a ramp signal changing the signal level at a third changing rate depending on elapsed time within a third amplitude range and an optical signal. The third S digital signal generated as a result of the third comparison is a third digital signal.

The memory 106 holds the third S digital signal held in the counter 105. The counter 105 then resets the signal value of the count signal to an initial value.

Also in FIG. 2C, the second S conversion period S2 has an equal length to that of the first S conversion period S1. Because the changing rate depending on elapsed time of the ramp signal VRMP2 is four times the changing rate depending on elapsed time of the ramp signal VRMP1, the amplitude of the ramp signal VRMP2 at the time T11 is four times the amplitude of the ramp signal VRMP1 at the same time. Therefore, the amplitude in which the signal level of the ramp signal VRMP2 changes is larger than the amplitude in which the signal level of the ramp signal VRMP1 changes.

The amplitude range in which the signal level of the ramp signal VRMP changes is equal to the AD conversion of the first N conversion period N1 and the AD conversion of the second N conversion period N2. The amplitude range in which the signal level of the ramp signal VAMP of an AD conversion in the first S conversion period S1 changes is a first amplitude range in both of the operations in FIGS. 2B and 2C. The amplitude range in which the signal level of the ramp signal VRMP of AD conversion in the second S conversion period S2 is a second amplitude range in the operations in FIG. 23 and is a third amplitude range in the operations in FIG. 2C. According to this exemplary embodiment, the first amplitude range and the second amplitude range are equal to each other. The third amplitude range is larger than the first amplitude range and the second amplitude range.

In the operations illustrated in FIG. 2B, the second S digital signal is a signal based on a result of addition of digital signals generated by performing a plurality of AD conversions on an S signal. Because of the addition of digital signals generated by performing a plurality of AD conversions, the second S digital signal can have reduced random noise compared with a digital signal acquired by performing one AD conversion on an S signal. Therefore, the imaging apparatus of this exemplary embodiment can advantageously output digital signals having reduced random noise.

The case where the amplitude of an S signal is larger than the amplitude of the ramp signal VRMP1 at the time T9 in the operations illustrated in FIG. 2C is caused when the photodiode PD in the pixel 100 having output the S signal receives light of a high-luminance object. In this case, the noise contained in a digital signal acquired by performing an AD conversion on an S signal dominantly includes light shot noise and includes ignorable amount of random noise. Therefore, the imaging apparatus of this exemplary embodiment defines one digital signal based on an S signal for a high luminance object in which random noise is not noticeable and generation of a digital signal based on an S signal is performed twice for a low-luminance object in which random noise is noticeable.

According to the configuration disclosed in Japanese Patent Laid-Open No. 2010-103913, ramp signals having an identical changing rate depending on elapsed time is used a plurality of number of times to perform a plurality of AD conversions. The ramp signals to be used here should have an amplitude including all possible amplitudes of an S signal so that AD conversions can be performed on the S signal. For example, the ramp signal VRMP2 described in conjunction with the operations in FIG. 2C of this exemplary embodiment includes all possible amplitudes of an S signal. On the other hand, in order to perform AD conversions to allow reduction of random noise, the changing rate depending on elapsed time of the ramp signal may be required to be lowered to increase the resolution of the AD conversions. Therefore, a ramp signal having a small changing rate depending on elapsed time, such as the ramp signal VRMP1 according to this exemplary embodiment, may be used. When a ramp signal having a small changing rate depending on elapsed time is changed to include all possible amplitudes of the S signal, the AD conversion period is increased. For example, when the ramp signal VRMP1 according to this exemplary embodiment changes the signal level to include all possible amplitude ranges, of the S signal, a period four times the first S conversion period S1 may be required. Therefore, in Japanese Patent Laid-Open No. 2010-103913, performing a plurality of AD conversions for reducing random noise with high accuracy increases the AD conversion period.

On the other hand, in Japanese Patent Laid-Open No. 2010-103913, when a ramp signal having a large changing rate depending on elapsed time is used to perform a plurality of AD conversions, the accuracy for the reduction of random noise may decrease.

In the imaging apparatus according to this exemplary embodiment, the number of AD conversions is changed in accordance with the amplitude of an S signal. When the amplitude of the S signal is larger than a predetermined threshold, the changing rate depending on elapsed time of the ramp signal is increased to perform the AD conversions. Thus, the imaging apparatus of this exemplary embodiment allows reduction of random noise and can increase the speed of AD conversions.

The maximum amplitude of the ramp signal VRMP1 of a first S conversion S1 may be adjusted in order to reduce the period required for performing a plurality of AD conversions and at the same time to generate a digital signal having reduced random noise of the S signal. More specifically, the maximum amplitude of the ramp signal VRMP1 in the first S conversion period S1 may be $1/2^N$ being a maximum amplitude of the ramp signal VRMP2 in the second S conversion period S2. Furthermore, the maximum amplitude of the ramp signal VRMP1 in the first S conversion period S1 may be equal to or lower than $1/2$ and equal to or higher than $1/8$ of the maximum amplitude of the ramp signal VRMP2 of the second S conversion period S2.

A second digital N signal output from the imaging apparatus is a signal acquired by averaging fluctuations (random noise) contained in an N signal. Thus, the AD converting unit 200 can acquire a signal as a result of reduction of random noise contained in the N signal.

A signal processing unit, not illustrated, provided externally to the imaging apparatus performs a correlated double sampling (CDS) process for acquiring a difference between the second N digital signal and the second S digital signal. The signal processing unit uses the difference to generate an image. It should be noted that the signal processing unit may be implemented by a output signal processing unit 155 according to a third exemplary embodiment, which will be described below.

On the other hand, when the first S digital signal is not generated, a difference between the second N digital signal and the third S digital signal is acquired. The signal processing unit uses the difference to generate an image.

This exemplary embodiment assumes N1=N2<S1=S2 as the relationship among lengths of the first N conversion period N1, the second N conversion period N2, the first S conversion period S1, and the second S conversion period S2. Because a noise signal has a small amplitude, the random noise tends to be noticeable. Therefore, as the N signals, a plurality of digital signals are acquired by using the ramp signal VRMP1 having an identical changing rate depending on elapsed time within an identical amplitude range. Thus, digital signals which allow reduction of random noise of the N signals can be acquired.

While the processor acquiring a difference between the second S digital signal or third S digital signal and the second N digital signal is performed externally to the imaging apparatus according to this exemplary embodiment, the process may be performed within the imaging apparatus. In this case, the imaging apparatus outputs a difference between the second S digital signal or third S digital signal and the second N digital signal to a signal processing unit provided externally to the imaging apparatus. The signal processing unit may perform a CDS process for acquiring a signal of the difference output from the imaging apparatus and then generate an image.

Having described that, according to this exemplary embodiment, two AD conversions are performed in the operations in FIG. 2B, more AD conversions may be performed. In this case, the operations in FIG. 2C may include a plurality of AD conversions using the ramp signal VRMP2. At that time, also in the operations in FIG. 2C, the counter 105 operates so as to add count signals of a plurality of AD conversions using the ramp signal VRMP2. Thus, in the operations in FIG. 2C, digital signals containing random noise that can be reduced can be generated.

The imaging apparatus of this exemplary embodiment performs AD conversions in the first S conversion period S1, including setting the changing rate depending on elapsed time of the ramp signal VRMPI for the AD conversions in the second S conversion period S2 and AD conversions with a smaller amplitude of S signals. On the other hand, in some case, the AD conversions in the first S conversion period S1 may be performed by comparing a signal set to a predetermined threshold voltage and the S signal and setting the changing rate depending on elapsed time of the ramp signal VRMP1 for AD conversions in the second S conversion period S2 based on the comparison result, without operating the counter 105. Against the case, because the imaging apparatus of this exemplary embodiment can also use the AD conversion in a case where the S signals have a smaller amplitude, digital signals in which random noise can be reduced can be acquired.

As described above, the imaging apparatus of this exemplary embodiment performs a predetermined number of AD conversions when S signals have a larger amplitude than a threshold and, when the S signals have a smaller amplitude than a threshold, performs more AD conversions than those performed when the amplitude of the S signals is smaller than the threshold. Thus, the imaging apparatus of this exemplary embodiment can properly balance the lengths of the periods required for AD conversions and the width of the dynamic range.

According to this exemplary embodiment, the ramp signals VRMP1 in the first S conversion period S1 and the second S conversion period S2 have an equal changing rate depending on elapsed time. As another example, the changing rate depending on elapsed time of the ramp signal VRMP1 in the second S conversion period S2 may be changed with respect to the ramp signal VRMP1 in the first S conversion period S1. In this case, the counting operation to be performed by the counter 105 may be changed to acquire an equal AD conversion gain between the AD conversions in the first S conversion period S1 and the AD conversions in the second S conversion period S2.

According to this exemplary embodiment, the changing rate depending on elapsed time of the ramp signal VRMP2 is four times the changing rate depending on elapsed time of the ramp signal VRMP1. Without limiting to the example, the changing rate depending on elapsed time of the ramp signal VRMP2 may only be required to be larger than the changing rate depending on elapsed time of the ramp signal VRMP1. The changing rate depending on elapsed time of the ramp signal VRMP2 may be $2^N$ times the changing rate depending on elapsed time of the ramp signal VRMP1. This is for facilitating to acquire equal AD conversion gains of digital signals generated by operations of AD conversions performed both in the first S conversion period S1 and the second S conversion period S2. More specifically, it is because the operation for generating count signals by the counter 105 can be performed by bit-shifting to a higher level by N bits.

The imaging apparatus of this exemplary embodiment is not limited to those examples as described above but may be changed in various manners. Variation examples will be described below.

According to this exemplary embodiment, a CDS process is performed in a following stage of the memory 106. As another example, the counter 105 may perform the CDS process. More specifically, after the second N conversion period N2, the counter 105 acquires a complement of 2 of the second N digital signal. The complement is held in the counter 105. The counter 105 starts counting clock signals in the first S conversion period S1 from the held complement as the initial value. In this case, a result of the CDS process may be output by horizontal scanning after the second S conversion period S2 without requiring the horizontal scanning after the second N conversion period N2.

In the first and second N conversion periods, the counter 105 down-counts and holds a negative counted value and then starts up-counting from the initial value of the counter 105 in the first S conversion period S1.

Having described that two AD conversion periods are provided for an N signal, more AD conversion periods may be provided. Because the number of times of generation of digital N signals based on an N signal is increased, a digital signal based on an N signal having reduced random noise can be generated.

Figure 3:
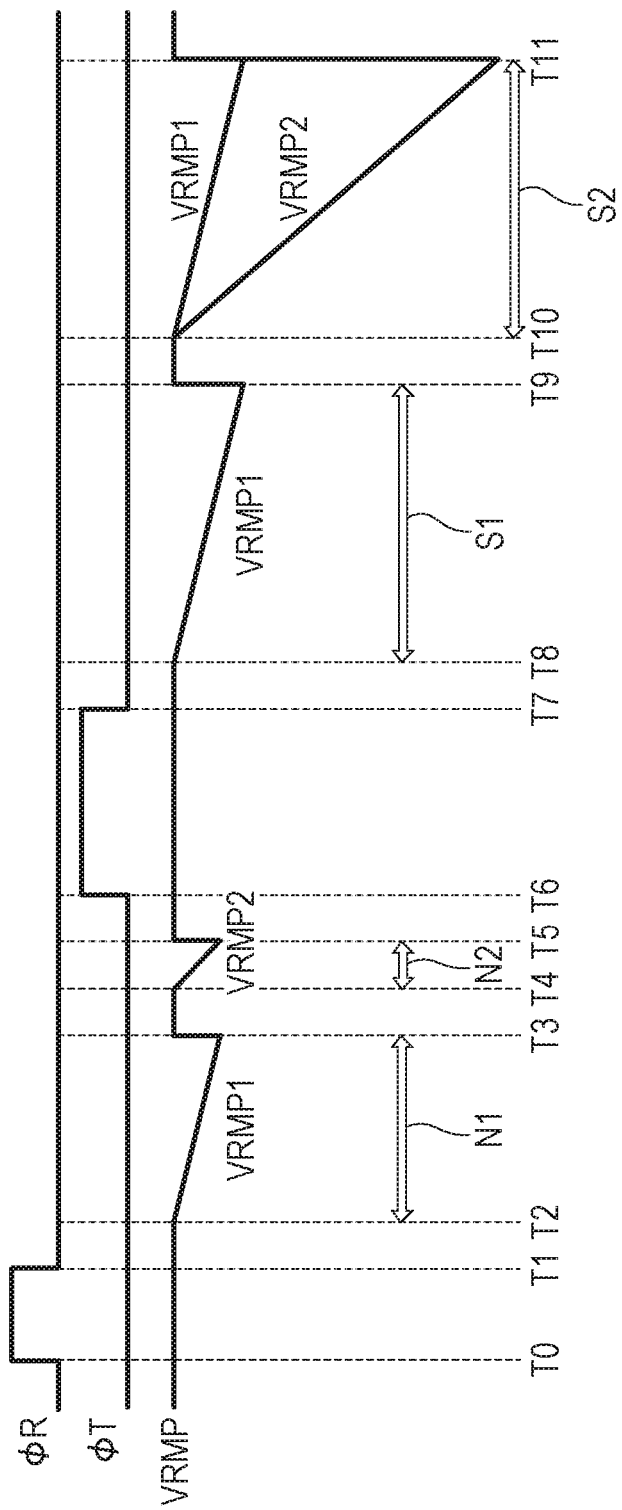
FIG. 3 illustrates an example of operations of an imaging apparatus.

As illustrated in FIG. 3, the ramp signal VRMPI to be used in the second N conversion period N2 may be the ramp signal VRMP2. In this case, after the memory 106 holds the first N digital signal, the counter 105 resets the signal value of the count signal to the initial value. The AD conversions performed in the second N conversion period N2 can result in a second N digital signal. The memory 106 further holds the second N digital signal. Through the subsequent horizontal scanning, the memory 106 outputs the first N digital signal and the second N digital signal. The signal processing unit acquires a difference between the second S digital signal generated by the operations in FIG. 2B and the doubled first N digital signal. On the other hand, a difference between the third S digital signal generated by the operations in FIG. 2C and the second N digital signal.

According to this exemplary embodiment, the second S digital signal is generated by adding, in the counter 105, a count signal resulting from an AD conversion in the second S conversion period S2 to the first S digital signal. As another example, after the first S digital signal is held in the memory 106, the counter 105 resets the signal value of the count signal to the initial value. The AD conversions performed in the second S conversion period S2 can result in a second S digital signal, and the memory 106 further holds the second S digital signal. Through the subsequent horizontal scanning, the memory 106 outputs the first S digital signal and the second S digital signal. A signal processing unit may add the first S digital signal and the second S digital signal. In the same manner, a second N digital signal may be generated without adding a count signal to the first N digital signal in the counter 105. Also in this case, the signal processing unit may add the first N digital signal and the second N digital signal. In this case, the signal processing unit is an adding unit configured to add digital signals generated by a plurality of AD conversions.

According to this exemplary embodiment, each of the plurality of AD converting units 200 has the counter 105. As another example, a counter may be included which supplies a common count signal to the memories 106 in the plurality of AD converting units 200. In this case, the counter does not perform the up-count operation for generation of a count signal, which is performed in the AD conversions in the second S conversion period S2 in FIG. 2C according to this exemplary embodiment. In a case where AD conversions in the second S conversion period S2 are performed in the operations in FIG. 2C, the memories 106 of each column may bit shift a count signal supplied from the counter to an upper level and hold the result. Thus, like the imaging apparatus of this exemplary embodiment, AD conversion gains may be added in the AD conversions in the second S conversion periods S2 in FIGS. 2B and 2C. The bit shift may not be necessarily performed in the memory 106. For example, the signal processing unit which receives input of digital signals output by the memories 106 through horizontal scanning may perform the bit shift.

As another example, an amplifier may be provided in an electrical path between the vertical signal line 110 and the comparator 104. The amplifier outputs to the comparator 104 signals acquired by amplifying an N signal and an S signal output to the vertical signal line 110. In this case, the first N digital signal and the second N digital signal are signals based on a signal acquired by amplifying an N signal by the amplifier. The first S digital signal, the second S digital signal, and the third S digital signal are signals based on a signal acquired by amplifying an S signal by the amplifier.

As another example, a correlated double sampling (CDS) circuit may be provided in an electrical path between the vertical signal line 110 and the comparator 104. The CDS circuit outputs a signal acquired by subtracting an N signal from an S signal output to the vertical signal line 110. In this case, the first N digital signal and the second N digital signal dominantly contain noise and offset caused by the comparator 104.

Having described that the ramp signal VRMP1 and the ramp signal VRMP2 are signals having signal levels changing in a slopewise manner, they may be signals having signal levels changing in a stepwise manner. The signals having signal levels changing in a stepwise manner are also ramp signals having signal levels changing depending on elapsed time.

Second Exemplary Embodiment

An imaging apparatus according to a second exemplary embodiment will be described with focus on differences from the first exemplary embodiment.

The imaging apparatus according to the first exemplary embodiment changes the changing rate depending on elapsed time of a ramp signal VRMP1 to be input to the comparator 104 in accordance with the amplitude of an S signal. According to this exemplary embodiment, a signal acquired by amplifying an S signal is input to the comparator 104. The imaging apparatus of this exemplary embodiment is different from the imaging apparatus of the first exemplary embodiment in that the amplification factor of an S signal is changed in accordance with the amplitude of the S signal.

Figure 4:
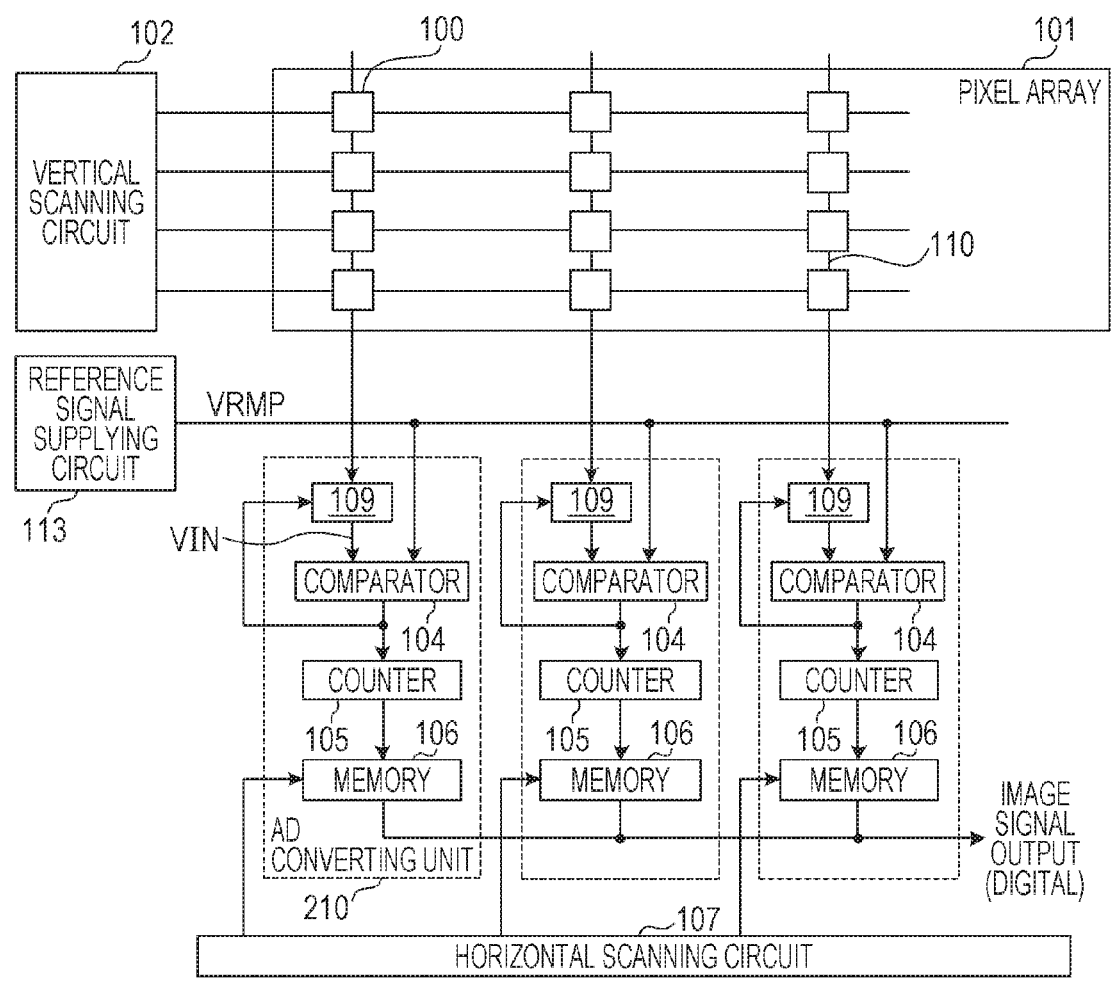
FIG. 4 illustrates an example of a configuration of an imaging apparatus.

FIG. 4 illustrates a configuration of an imaging apparatus according to this exemplary embodiment. Like numbers refer to like parts having like functions in FIG. 1A and FIG. 4.

The reference signal supplying circuit 113 outputs a ramp signal VRMP to the comparators 104 of each column.

An amplifying circuit 109 outputs to the corresponding comparator 104 signals acquired by amplifying an N signal and an S signal output from the corresponding pixel 100 to the vertical signal line 110. The signal VIN of this exemplary embodiment is representative of a signal to be output from the amplifying circuit 109 to the comparator 104. The amplifying circuit 109 of this exemplary embodiment has amplification factors of 1× and 4×. An amplification factor of 4× is called a first amplification factor, and an amplification factor of 1× is called a second amplification factor. An amplification factor of 1× also comes under an amplification category herein. The first amplification factor is preferably $2^N$ times the second amplification factor. A signal acquired by amplifying an N signal to be output by the amplifying circuit 109 will be called amplified N signal. A signal acquired by amplifying an S signal to be output by the amplifying circuit 109 will be called amplified S signal. The amplified S signal is an amplified signal generated by amplifying an optical signal by the amplifying circuit 109 being an amplifying unit. A first amplified signal is an amplified S signal acquired by amplifying an S signal with an amplification factor of 4× being the first amplification factor. A second amplified signal is an amplified S signal acquired by amplifying an S signal with an amplification factor of 1× being the second amplification factor. A third amplified signal is an amplified N signal acquired by amplifying an N signal with an amplification factor of 4× being the first amplification factor.

Figure 5A:
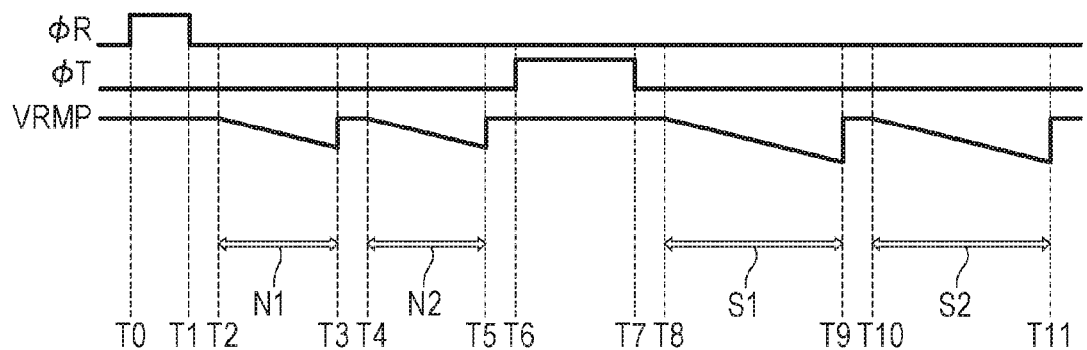
FIG. 5A illustrates an example of an operation of an imaging apparatus.

FIG. 5A illustrates operations of the imaging apparatus illustrated in FIG. 4. All of ramp signals VRMP to be used in the first N conversion period N1, the, second N conversion period N2, the first S conversion period S1, and the second S conversion period S2 have an equal changing rate. The amplitude range in which the signal level of the ramp signal VRMP changes is equal to the AD conversion of the first N conversion period N1 and the AD conversion of the second N conversion period N2. The amplitude range in which the signal level of the ramp signal VRMP changes is equal to the AD conversion of the first S conversion period S1 and the AD conversion of the second S conversion period S2. The amplitude range in which the signal level of a ramp signal VRMP changes with the AD conversions in the first S conversion period S1 and the AD conversions in the second S conversion period S2 is larger than the amplitude range with the AD conversions in the first N conversion period N1 and the AD conversion of the second N conversion period N2.

Figure 5B:
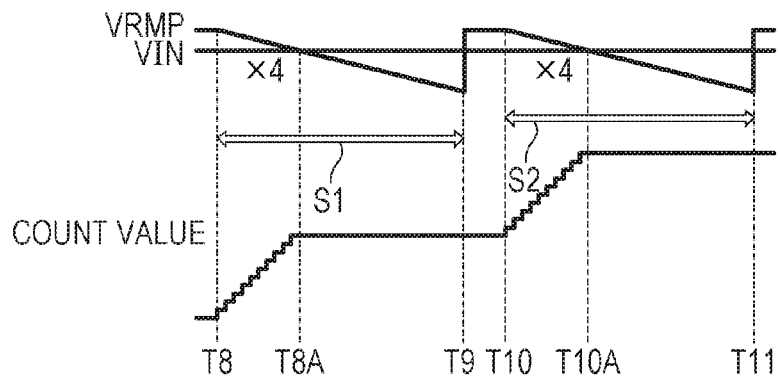
FIG. 5B illustrates an example of operations of an imaging apparatus.

FIG. 5B illustrates a case where the amplitude of an S signal is equal to or smaller than the amplitude of a ramp signal VRMP at a time T9. In the first S conversion period S1, the amplifying circuit 109 amplifies an S signal with an amplification factor of 4×.

The other operations are the same as the operations in the first S conversion period S1 described with reference to FIG. 2B. A change of the signal value of a comparison result signal at a time T8A is output to the counter 105 and the amplifying circuit 109. The amplifying circuit 109 in response to a change of the signal value of the comparison result signal keeps an amplification factor of 4× for an S signal in the second S conversion period S2.

The operations in the second S conversion period S2 are the same as the operations described with reference to FIG. 2B. In response to a change of the signal value of a comparison result signal at a time T10A, the second S digital signal is generated.

Figure 5C:
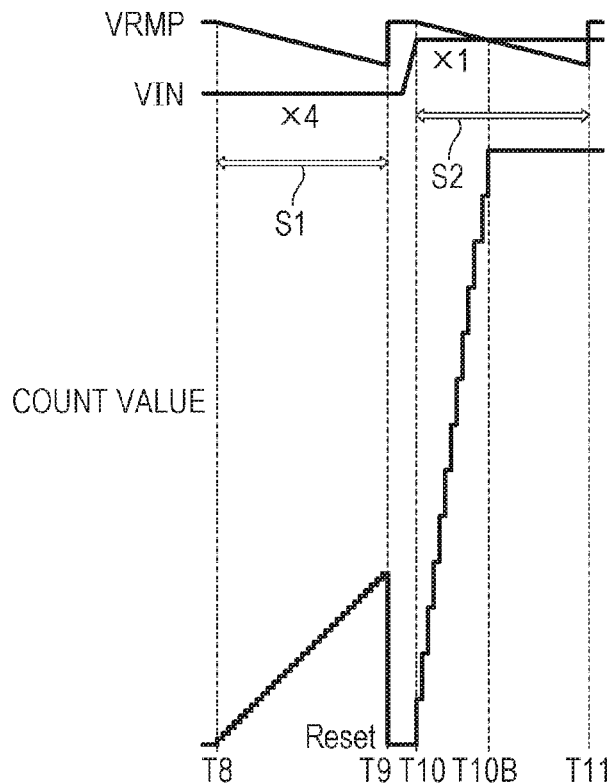
FIG. 5C illustrates an example of operations of an imaging apparatus.

FIG. 5C illustrates a case where the amplitude of an S signal is larger than the amplitude of the ramp signal VRMP at the time T9. In the first S conversion period S1, the amplifying circuit 109 amplifies an S signal by an amplification factor of 4×.

In response to no change of the signal value of the comparison result signal in the period from the time T8 to the time T9, the amplifying circuit 109 changes the amplification factor for an S signal in the second S conversion period S2 to 1×. The other operations are the same as the operations described with reference to FIG. 2C. In response to a change of the signal value of the comparison result signal at a time T10B, the third S digital signal is generated.

According to the configuration disclosed in Japanese Patent Laid-Open No. 2010-183913, an amplitude range in which the signal level of a ramp signal VRMP changes is required so as to include all of the amplitude range of the amplified S signal acquired by amplifying an S signal by 4. On the other hand, the imaging apparatus according to this exemplary embodiment changes the amplification factor of the amplifying circuit 109 in the second S conversion period S2 based on a result of AD conversions in the first S conversion period S1. This configuration can reduce the amplitude range in which the signal level of the ramp signal VRMP changes. Thus, the period required for a plurality of AD conversions can be reduced, compared with the configuration in Japanese Patent Laid-Open No. 2010-103913. Furthermore a second S digital signal being a signal from which random noise can be reduced can be acquired.

It should be understood that various changes can also be made to the imaging apparatus according to this exemplary embodiment, as in the first exemplary embodiment.

Third Exemplary Embodiment

An imaging apparatus according to a third exemplary embodiment will be described with focus on differences from the first exemplary embodiment. FIG. 7 illustrates a configuration of an imaging apparatus according to this exemplary embodiment.

Like numbers refer to like parts having like functions in FIG. 1A and FIG. 7.

The imaging apparatus according to this exemplary embodiment includes a plurality of AD converting units 2000. Each of the AD converting units 2000 has a selecting circuit 108, a comparator 104, a second selecting circuit 120, a first memory group 121, a second memory group 122, and a decision signal memory 128.

The second selecting circuit 120 outputs a control signal VCOMP being a comparison result signal to one of the first memory group 121, the second memory group 122, and the decision signal memory 128.

A counter 1050 outputs a count signal group 123 being count signals including a 11-bit Gray code signal, for example, through a plurality of signal lines. The plurality of signal lines to which the count signal group 123 is output from the counter 1050 are commonly connected to the first memory group 121 and second memory group 122 of each column. The value (count signal) exhibited by the count signal group 123 corresponds to an elapsed time from start of a change of a ramp signal VRMPI. The first memory group 121 and the second memory group 122 hold a count signal corresponding to a time point when the signal value of the control signal VCOMP changes as a digital signal being a result of AD conversions. The digital signals held in the first memory group 121 and the second memory group 122 are sequentially output by scanning from the horizontal scanning circuit 107 to a circuit in a following stage of the imaging apparatus through the output line 124. According to this exemplary embodiment, two of the first memory group 121 and second memory group 122 are provided in the AD converting unit 2000 as memory groups configured to hold digital signals resulting from AD conversions.

The decision signal memory 128 is configured to hold a control signal VCOMP.

FIGS. 8A and 8B illustrate a configuration of the memories included in one AD converting unit 2000 according to this exemplary embodiment. FIG. 8A illustrates the first memory group 121, the second memory group 122, and the decision signal memory 128. FIG. 8B is a block diagram illustrating in more detail the configuration of memories included the first memory group 121 and the second memory group 122.

The counter 1050 outputs a count signal group 123 including 12 count signals through 12 signal lines. It is assumed here that count signals 123-0 to 123-10, and 123-3M are transmitted through the respective signal lines. The count signals 123-0 to 123-10 configure a 11-bit Gray code signal having the count signal 123-0 as a least significant bit and the count signal 123-10 as a most significant bit. The count signals 123-0, 123-1, 123-2, and 123-3M configure a 4-bit Gray code signal having the count signal 123-0 as a least significant bit and the count signal 123-3M as a most significant bit.

The first memory group 121 includes 5-bit memories 121-0 to 121-3. The memories 121-0 to 121-3 receive input of the count signals 123-0, 123-1, 123-2, and 123-3M. The memory 121-C receives input of the control signal VCOMP. The second memory group 122 includes 11-bit memories 122-0 to 122-10. The memories 122-0 to 122-10 receive input of the count signals 123-0 to 123-10.

FIG. 8B illustrates a configuration example of the first memory group 121 and the second memory group 122. The configuration of the memory 122-0 will be described as a typical example of those memories though the other memories can also have the same configuration. The memory 122-0 of this exemplary embodiment is configured to hold two digital signals so that a video signal processing unit within the imaging apparatus or in a following stage of the imaging apparatus can perform a digital correlated double sampling (CDS) process. The memory 122-0 has an N latch 200-N configured to hold an AD conversion result of a signal at a reset level and an S latch 200-S configured to hold an AD conversion result of an optical signal. Here, the number of memories included in the first memory group 121, that is, the bit width of the first memory group 121 is defined to a value higher than the highest value of difference values between AD conversion results of a plurality of AD conversions performed on one signal. Those difference values are mainly due to a random noise component superimposed on a pixel signal VIN and a ramp signal VRMP and a random noise component generated by the comparator 104. Thus, a plurality of bit values which may change between two AD conversion results.

For example, when the absolute value of the difference value between the first and second AD conversion results is equal to or lower than $2^N-1$ [LSB], the bit width required for the first memory group 121 is equal to N+1 bits. This exemplary embodiment assumes that N=3, that is, the absolute value of the difference value is equal to or lower than 7 [LSB] and therefore the bit width of the first memory group 121 is equal to 4 bits. This is because the higher 7 bits (=11 bits−4 bits) of AD conversion results have an identical value in the first AD conversion and the second AD conversion and the bit width of the first memory group 121 may therefore be equal to at least 4 bits.

Figure 9A:
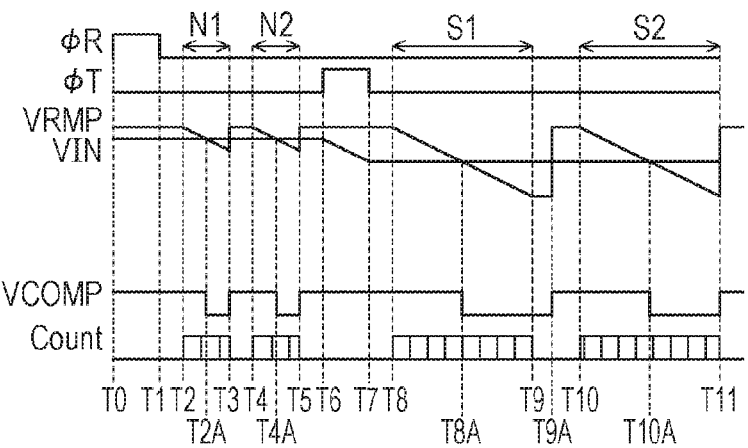
FIG. 9A illustrates an example of operations of an imaging apparatus.
Figure 9B:
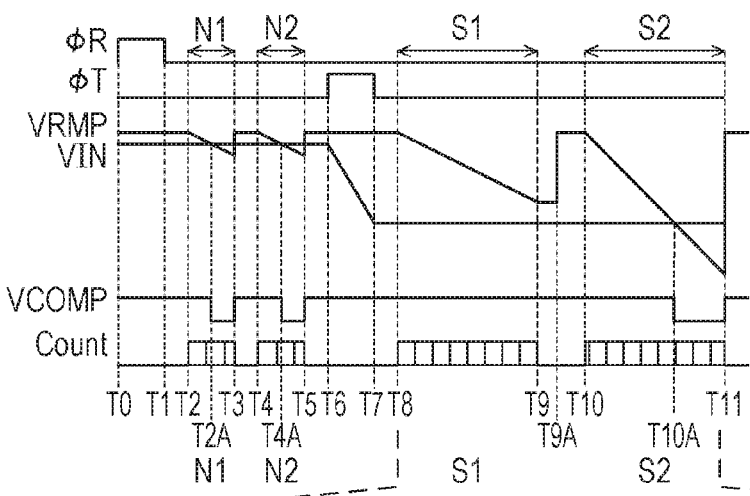
FIG. 9B illustrates an example of operations of an imaging apparatus.
Figure 9C:
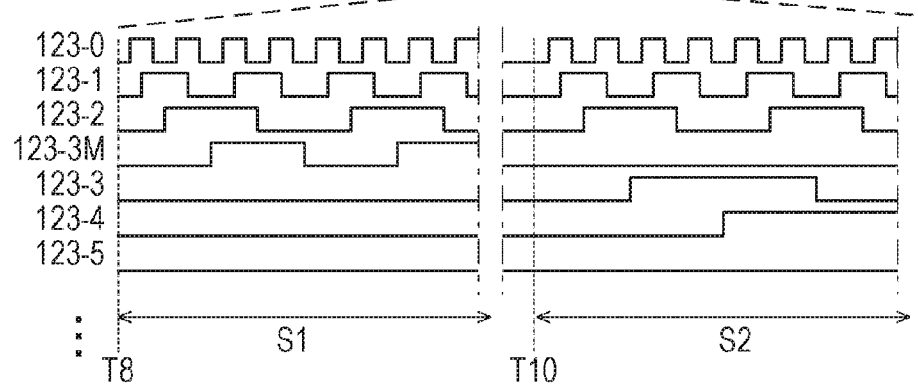
FIG. 9C illustrates an example of operations of an imaging apparatus.
Figure 9D:
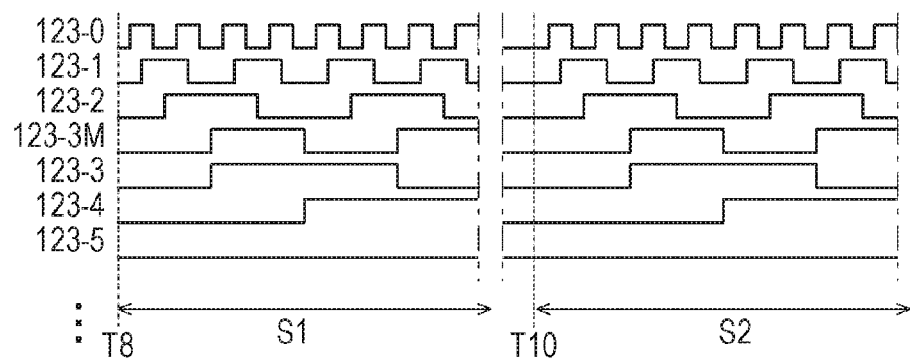
FIG. 9D illustrates an example of operations of an imaging apparatus.

Next, operations of the imaging apparatus according to this exemplary embodiment will be described with reference to FIGS. 9A to 9D. FIGS. 9A and 9B are timing chart illustrating operations of the whole imaging apparatus of this exemplary embodiment. FIG. 9A illustrates a case where an object has a low luminance, and FIG. 9B illustrates a case where an object has a high luminance. FIG. 9C is a timing chart illustrating count signals. FIG. 9D is a timing chart illustrating a variation example of count signals.

First, in a period from a time T0 to a time T1, a control signal φR is changed to have a high level, which turns on a reset transistor M1. Thus, the voltage of the floating diffusion FD is reset to a predetermined voltage level. After that, in a period N1 from a time T2 to a time T3 and a period N2 from a time T4 to a time T5, two AD conversions are performed on the pixels signal VIN at a reset level.

First of all, the first AD conversion in a period N1 will be described. In the period N1, the second selecting circuit 120 selects the first memory group 121 as an output destination of the control signal VCOMP. At the time T2, the voltage of the ramp signal VRMP output from the reference signal supplying circuit 103 starts to decrease. At the same time, the number of count signals included in the count signal group 123 output from the counter 1050 start to increase depending on elapsed time. At the time point, because the voltage of the ramp signal VRMP is higher than the voltage of the pixel signal VIN at the reset level, the control signal VCOMP output from the comparator 104 has a high level.

After that, at a time T2A when the voltage of the ramp signal VRMP is changed to be lower than the voltage of the pixel signal VIN at the reset level, the magnitude relationship between the voltage of the ramp signal VRMP and the voltage of the pixel signal VIN at the reset level is changed so that the control signal VCOMP is changed to have a low level. The first memory group 121 holds count signals included in the count signal group 123 at the time T2A as digital signals at the reset level after the AD conversion. The first memory group 121 includes four memories 121-0 to 121-3. In other words, because the first memory group 121 has a bit width of 4 bits, the digital signals to be held in the first memory group 121 in the period N1 are lower 4 bits only from the least significant bit to the fourth bit of the count signals included in the count signal group 123.

After that, a second AD conversion is performed in a period N2. In the period N2, the second selecting circuit 120 selects the second memory group 122 as an output destination for the control signal VCOMP. The AD conversion is performed in the same manner as described above. At a time T4A, the second memory group 122 holds count signals included in the count signal group 123 at the time T4A as digital signals at the reset level after the AD conversion. The second memory group 122 includes 11 memories 122-0 to 122-10. In other words, because the second memory group 122 has a bit width of 11 bits, the digital signals to be held in the second memory group 122 in the period N2 are from the least significant bit to the eleventh bits of the count signals included in the count signal group 123. The digital signals acquired by the AD conversions in the period N1 and period N2 are held in the N latch 200-N at the corresponding memory. It is assumed that the gradient of the ramp signal VRMPI to be used for the second AD conversion in the period N2 is equal to the gradient of the ramp signal VRMPI to be used for the first AD conversion in the period N1.

After that, in a period from a time T6 to a time T7, a control signal φT is changed to have a high level, which turns on the transfer transistor M2. Thus, electric carriers generated from incident light in the photodiode PD are transferred to the floating diffusion FD. In response to the transfer of the electric carriers, the voltage of the pixel signal VIN decreases. At the time T7, the voltage of the pixel signal VIN is changed to have a value according to the optical signal because of the transfer of electric carriers. After that, in an S conversion period S1 from a time T8 to a time T9 and a conversion period S2 from a time T10 to a time T11, two AD conversions are performed on pixel signals VIN having the level of the optical signal.

AD conversion operations in the S conversion periods S1 and S2 will be described. In the AD conversion in the S conversion period S1, the selecting circuit 108 selects and outputs a VRMP1 signal. The selecting circuit 108 uses the control signal VCOMP at the time T9 to select a ramp signal to be used for the AD conversion in the S conversion period S2. In the S conversion period S1 and S conversion period S2, digital signals acquired by performing the AD conversions are saved in an S latch 200-S of the corresponding memory. The decision signal memory holds the level of the control signal VCOMP output by the comparator 104 at the time T9.

The AD conversion operations in the S conversion periods S1 and S2 will be described separately in terms of a case where the photodiode PD receives light from a high-luminance object and a case where the photodiode PD receives light from a low-luminance object. The threshold for determining the "low luminance" and the "high luminance" of an object is the level of the ramp signal VRMPI at the time T9.

FIG. 9C illustrates count signals 123-0 to 123-5 of the lower 6 bits of the count signal group 123 and pulses of the count signal 123-3M in the S conversion period S1 and the S conversion period S2.

At the time T8 when the S conversion period S1 starts, the count signals 123-0 to 123-2 and 123-3M exhibits a Gray code value of "0000" ("0" in the decimal numbering system). At and after the time T8, the value increases depending on elapsed time. When the Gray code value reaches "1000" ("15" in the decimal numbering system), it returns to "0000" again. The count signals 123-4 to 123-10 always have a low level (0). In the S conversion period S1, as described above, the 4 bit Gray code signal configured by the count signals 123-0 to 123-2 and 123-3M repeats counts 0 to 15. Therefore, at the time T8A when the level of the control signal VCOMP is changed, the S latches 200-S in the first memory group 121 holds one of the count signals 0 to 15 in Gray code.

During a period from the time T9 when the S conversion period S1 ends to a time T9A, the decision signal memory 128 holds the signal VCOMP having a low level. When an object has a low luminance, that is, when the signal VIN has an amplitude smaller than the ramp signal VRMPI at the time T9, the control signal VCOMP changes from a high level to a low level during the S conversion period S1. Because the signal VCOMP has a low level at the time T9A, the selecting circuit 108 selects VRMP1 as a signal to be output in the S conversion period S2.

At the time T10 when the S conversion period S2 starts, the count signals 123-0 to 123-10 exhibits a Gray code value of "0 . . . 0000" ("0" in the decimal numbering system). After the time T10, the values exhibited by the count signals 123-0 to 123-10 increase depending on elapsed time. In the S conversion period S2, as described above, 11-bit Gray code configured by the count signals 123-0 to 123-10 is counted. Therefore, at the time T10A when the level of the signal VCOMP changes, the S latches 200-S in the second memory group 122 hold count signals in the 11-bit Gray code.

According to this exemplary embodiment, as described above, two AD conversions are performed in two periods of the S conversion periods S1 and S2. Because the count signal to be held in the S conversion period S2 is 11 bits, that is, all bits of the count signal group 123, the count signal to be held in the S conversion period S1 is lower 4 bits of the count signal group 123. The digital signals acquired in the S conversion periods S1 and S2 as described above may be used to add or average results of the two AD conversions so that noise included in the AD conversion results can be reduced.

Referring count signals in FIG. 9C. The count signal output in the S conversion period S1 is different from the count signal output in the S conversion period S2. Particularly, in the S conversion period S1, the count signals 123-3 to 123-10 not related to the AD conversion operations have a low level at all times. Thus, the power consumption can be reduced, compared with a case where the levels of the count signals 123-3 to 123-10 are also changed in the S conversion period S1. However, as in the variation example of the count signals illustrated in FIG. 9D, the count signal in the S conversion periods S1 and S2 have identical operating timing. In other words, the count signal output by the counter 1050 for the first AD conversion and the count signal output by the counter 1050 for the second AD conversion may be identical. In this case, the counter 1050 performs common operations in the first AD conversion and in the second AD conversion, which may simplify the control over the operations of the counter 1050.

Next, operations in the AD conversions in the S conversion periods S1 and S2 will be described in a case where an object has a high luminance. In the S conversion period S1, because the signal VRMPI has a amplitude smaller than the amplitude of the signal VIN, the signal VCOMP does not change in the S conversion period S1. Therefore, because the signal VCOMP does not change in the S conversion period S1, no count signals are held in the latches 200-S in the first memory group 121. The signal VCOMP after the S conversion period S1 ends also keeps a high level. During a period from the time T9 to the time T9A, the decision signal memory 128 holds the signal VCOMP having a high level. In this case, the selecting circuit 108 selects the ramp signal VRMP2 as a ramp signal VRMPI to be used in the S conversion period S2. The subsequent AD conversion operations at the time T9 are the same as those to be performed when an object has a low luminance.

Figure 10:
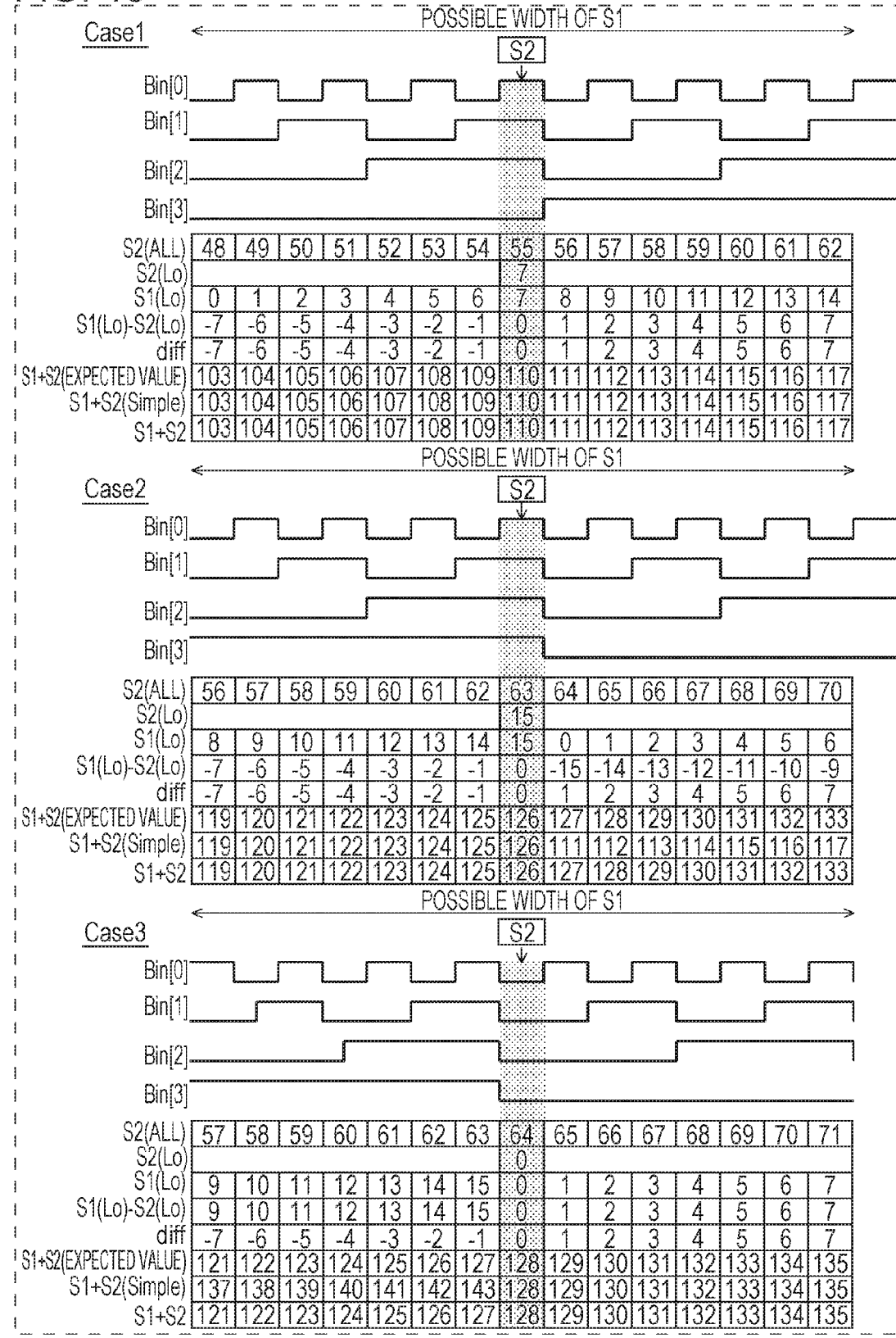
FIG. 10 illustrates an example of operations of an imaging apparatus.

Next, a processing method for acquiring a signal corresponding to a result of addition of two AD conversion results by using digital signals held in the first memory group 121 and second memory group 122 in a case where an object has a low luminance will be described with reference to FIG. 10. As described above, each memory group holds a lower 4-bit digital signal held in the S conversion period S1 and whole 11-bit digital signal held in the S conversion period S2. Therefore, because simple addition of them does not result in the target value, arithmetic operation processing which will be described below may be required. The arithmetic operation processing is performed digital signals after converted from Gray code to binary code.

It is assumed here that a lower 4-bit value held in the S conversion period S1 will be called S1 (Lo). All-bit, lower 4-bit and upper 7-bit values to be held in the S conversion period S2 will be called S2 (ALL), S2 (Lo), and S2 (Hi). Furthermore, though a digital signal held in the S conversion period S1 does not hold upper 7 bits according to this exemplary embodiment, it is assumed that the value if the digital signal holds all 11 bits is S1 (ALL) and the value of the upper 7 bits is S1 (Hi). Considering that the higher-order bits of digital signals after a plurality of AD conversions exhibits an equal value, the following expression is satisfied.

$$S1\ (Hi) = S2\ (Hi)$$

In this processing, digital signals held in the first memory group 121 and the second memory group 122 are used to acquire S1 (ALL)+S2 (ALL) which is a sum of two AD conversion results. Known values held in each memory group are S1 (Lo) and S2 (ALL). From this point of view, S1 (ALL)+S2 (ALL) is changed as follows.

$$\begin{aligned}S1(ALL) + S2(ALL) &= S1(Hi) + S1(Lo) + S2(Hi) + S2(Lo)\\ &= 2 \times S2(Hi) + S2(Lo) + S1(Lo)\\ &= 2 \times \{S2(Hi) + S2(Lo)\} + S1(Lo) - S2(Lo)\\ &= 2 \times S2(ALL) + \mathit{diff}\end{aligned}$$

where $\mathit{diff} = S1(Lo) - S2(Lo)$.

In other words, the value two times S2 (ALL) held in the second memory group 122 and a difference value diff (4 bit value) are added so that a value equal to S1 (ALL)+S2 (ALL) which is a sum of two AD conversion results can be calculated.

However, because possible values of S1 (Lo) and S2 (Lo) falls in a range of 0 to 15, directly applying the difference value diff in the expression above may result in an error due to carry or postponement from a lower-order bit to a higher-order bit. Therefore, digit processing such as carry or postponement may be required to be performed on the difference value diff with some combinations of S1 (Lo) and S2 (Lo). The type of digit processing is determined in accordance with the value of S1 (Lo)–S2 (Lo).

Case 1: −8<S1 (Lo)–S2 (Lo)<8
→No digit processing is required (diff=S1 (Lo)–S2 (Lo))
Case 2: S1 (Lo)–S2 (Lo)≤−8
→Digit processing is performed (diff=S1 (Lo)–S2 (Lo)+$2^4$)
Case 3: 8≤S1 (Lo)–S2 (Lo)
→Digit processing is performed (diff=S1 (Lo)–S2 (Lo)–$2^4$)

Types of digit processing will be described with reference to FIG. 10 and concrete examples thereof.

Case 1: −8<S1 (Lo)–S2 (Lo)<8
Bin[0] to Bin[3] are lower 4 bits of a waveform of each bit after S1 or S2 is binarized. A Row S2 (ALL) is an example of possible values of Bin[0] to Bin[3].

This case will further be described assuming that S2 (ALL) is "55" (binary value of "110111"). A row S2 (Lo) shows a value "7" (binary value of "0111") of lower 4 bit s when S2 (ALL) is "55". When S2 (ALL) is "55", the possible range of S1 (ALL) is "55"±7 [LSB]. A row S1 (Lo) shows "0" to "14" (binary values of "0000" to "1110") which are lower 4 bits of S1 (ALL).

A row S1 (Lo)–S2 (Lo) shows values acquired by subtracting S2 (Lo) from S1 (Lo), and the diff row shows a result after digit processing is performed thereon. Because digit processing is not performed in this case, a value identical to that of the row S1 (Lo)–S2 (Lo) can be acquired.

A row S1+S2 (expected value) shows expected values of an added value S1 (ALL)+S2 (ALL) of AD conversion results in a possible range ("55"±7[LSB]) of S1 (ALL) where S2 (ALL) is "55".

A row S1+S2 (Simple) shows the following expression which is a calculated value acquired if the digit processing is not performed.

$$2 \times S2\ (ALL) + S1\ (Lo) - S2\ (Lo)$$

A row S1+S2 shows the following expression which is a calculated value after digit processing is performed.

$$2 \times S2\ (ALL) + \text{diff}$$

Digit processing is required to be performed such that the value can be equal to S1+S2 (expected value). Because −8<S1 (Lo)−S2 (Lo)<8 in this case, no difference occurs between S1+S2 (Simple) and S1+S2 (expected value) in the illustrated possible range of S1. Therefore, no digit processing is required in this case.

Case 2: S1 (Lo)−S2 (Lo)≤−8

In this case, S2 (ALL) is "63" (a binary value of "111111"), and S2 (Lo) is "15" (a binary value of "1111").

A case where S1 (ALL) is "64"(a binary value of 1000000) which is higher than S2 (ALL) by "1" will be considered below. In this case, the value S1 (Lo) actually held in the first memory group 121 is "0" (a binary value of 0000), and the following expression is satisfied without performing digit processing.

$$S1\ (Lo) - S2\ (Lo) = 0 - 15 = -15$$

Therefore, the value of the row S1+S2 (Simple) corresponding to a sum of two AD conversion results without digit processing satisfies the following expression.

$$2 \times S2\ (ALL) + S1\ (Lo) - S2\ (Lo) = 63 \times 2 - 15 = 111$$

The result is different from "127" which is S1+S2 (expected value). The reason therefor will be described below. The lower 4 bit S2 (Lo) of a value "63" of S2 (ALL) is "15" (a binary value of "1111"). Here, S1 (Lo) which is a value of lower-order hits of S1 (ALL) which is higher than "63" of S2 (ALL) by "1" is "0" rather than "16" which is the value next to "15". This is because the bit width of the lower-order bit is only 4 bits. Therefore, S1+S2 (Simple) when no digit processing is performed is a value displaced from S1+S2 (expected value) by "16".

Therefore, in order to correct the displacement "16" of the value, diff may be required to be defined by the following expression for digit processing of carry.

$$\text{diff} = S1\ (Lo) - S2\ (Lo) + 2^4$$

As a result of calculation of S1 (ALL)+S2 (ALL) using the diff, the value of S1 (ALL)+S2 (ALL) after the carry processing can be expressed as the following expression.

$$2 \times S2\ (ALL) + \text{diff} = 2 \times 63 - 15 + 16 = 127$$

Thus, a result matched with S1+S2 (expected value) can be acquired. The case where S1 (Lo) is "0" has been described above, but the same processing may be performed in cases where S1 (Lo) is in a range of "1" to "6". The digit processing described above is not performed in a case where S1 (Lo) is in a range of "8" to "15".

Case 3: 8≤S1 (Lo)−S2 (Lo)

In this case, S2 (ALL) is "64" (a binary value of 1000000), and S2 (Lo) is "0" (a binary value of 0000).

An example in which S1 (ALL) is "63"(a binary value of "111111") which is larger than S2 (ALL) by "1" will be described, for example. At that time, the value S1 (Lo) actually held in the first memory group 121 is "15" (a binary value of "1111"), and if digit processing is not performed, the following expression is satisfied.

$$S1\ (Lo) - S2\ (Lo) = 15 - 0 = 15$$

Therefore, the value of the row S1+S2 (Simple) corresponding to a sum of two AD conversion results in a case where digit processing is not performed, the following expression is satisfied.

$$2 \times S2\ (ALL) + S1\ (Lo) - S2\ (Lo) = 64 \times 2 + 15 = 143$$

This result is different from "127" which is S1+S2 (expected value). In this case, diff may be required to be defined by the following expression for digit processing of postponement, conversely to Case 2.

$$\text{diff} = S1\ (Lo) - S2\ (Lo) - 2^4$$

As a result of calculation of S1 (ALL)+S2 (ALL) using the diff, the value of S1 (ALL)+S2 (ALL) after the postponement processing can be expressed as the following expression.

$$2 \times S2\ (ALL) + \text{diff} = 2 \times 64 + 15 - 16 = 127$$

Thus, a result matched with S1+S2 (expected value) can be acquired. The case where S1 (Lo) is "15" has been described above, but the same processing may be performed in cases where S1 (Lo) is in a range of "9" to "14". The digit processing described above is not performed in a case where S1 (Lo) is in a range of "0" to "7".

The digit processing has been described in terms of AD conversion results of an optical signal in a case where an object ha a low luminance. However, the same processing may be performed on AD conversion results at a pixel reset level. After the digit processing ends, performing digital CDS processing can provide image data from which noise included at a reset level can be removed. The aforementioned digit processing method may be performed in a following stage of each memory group within the imaging apparatus and may be performed by a video signal processing unit in a following stage of the imaging apparatus.

If an object has a high luminance, the aforementioned digit processing is not performed but processing which will be described below is performed.

In S2 conversion, when the ramp signal VRMP2 is used, this processing provides an AD conversion gain equivalent to that of an AD conversion on a ramp signal VRMP1. When the changing rate of the ramp signal VRMP2 is four times the changing rate of the ramp signal VRMP1, S2×4 is performed. This processing is performed after an S2 signal is converted from Gray code to binary code.

As described above, according to this exemplary embodiment, a plurality of AD conversions are performed on a pixel signal output from one pixel. Adding AD conversion results acquired by performing a plurality of AD conversions can reduce noise. This addition can reduce the bit width of the first memory group 121 compared with the all bit count of a signal in accordance with assumed noise. This can reduce the number of memories within the first memory group 121 compared with a case where the number of memories are set to be equal to the all bit count of a signal. For example, 11 memories are reduced to four memories in the example above. Therefore, the number of components of the imaging apparatus can be reduced.

Having described above that a count signal output from a counter signal group is Gray code, it may be any form except for Gray code. For example, binary code using normal binary digits may be applied. However, because one bit of Gray code is only changed when a count signal increments, the influence of a displacement in timing between an increment of a count signal and a change of a comparator output can be small. Therefore, Gray code may be applied to a count signal.

Having described that the bit width of the first memory group 121 is 4 bits, that the bit width of the second memory group 122 is 11 bits, and that the count signal exhibited by the count signal group 123 is also 11 bits, an embodiment of the present invention is not limited thereto. In other words, the bit count may be any arbitrary value without departing from the spirit and scope of the present invention. In more detail, the bit count may be generalized as described below. In a case where the absolute value of a difference value between the first and second AD conversion results is equal to or lower than $2^N-1$ [LSB] (where N is a natural number), the bit width of the first memory group 121 is N+1 bits. In this case, it is assumed that the bit width of the second memory group 122 and the bit count of a count signal exhibited by the count signal group 123 is M bits (where M is a natural number) higher than N+1. In this case, the first memory group 121 holds values from the least significant bit to the (N+1)th bit of the count signal group 123. The second memory group 122 holds values from the least significant bit to the Mth bit of the count signal group 123.

In this case, the aforementioned digit processing can be generalized by using N as will be described below.
Case 1: $-(2^N-1)<$S1 (Lo)$-$S2 (Lo)$<(2^N-1)\to$No digit processing
Case 2: S1 (Lo)$-$S2 (Lo)$\leq-(2^N-1)$
Digit processing is performed (diff=S1 (Lo)$-$S2 (Lo)$+2^{N+1}$)
Case 3: $(2^N-1)\leq$S1 (Lo)$-$S2 (Lo)
Digit processing is performed (diff=S1 (Lo)$-$S2 (Lo)$-2^{N+1}$)

Having described that the imaging apparatus is configured to perform two AD conversions and holds the AD conversion results in two memory groups, the number of AD conversions and the number of memory groups are not limited to two. For example, three or more AD conversions may be performed, and the AD conversion results may be held in three or more memory groups.

Having described that digital signals acquired by a plurality of AD conversions are added, the addition may be replaced by other methods. For example, the addition processing described above may be replaced by averaging processing which divides the added value by the number of added signals.

Fourth Exemplary Embodiment

This exemplary embodiment relates to an imaging system applying an imaging apparatus according to any one of the first to third exemplary embodiments.

The imaging system may be a digital still camera, a digital camcorder, or a surveillance camera, for example. FIG. 6 is a schematic diagram illustrating a case where the imaging apparatus is applied to a digital still camera as an example of the imaging system.

The imaging system illustrated in FIG. 6 has a barrier 151 for lens protection, a lens 152 for focusing an optical image of an object to an imaging apparatus 154, and a diaphragm 153 for adjustment of the amount of light to pass through the lens 152. The lens 152 and the diaphragm 153 configure an optical system which gathers light to the imaging apparatus 154. The imaging system illustrated in FIG. 6 further has an output signal processing unit 155 configured to process an output signal from the imaging apparatus 154. The output signal processing unit 155 is configured to perform operations including correcting or compressing as required and outputting the resulting signal.

The imaging system illustrated in FIG. 6 further has a buffer memory unit 156 configured to temporarily store image data and an external interface unit 157 for communication with an external computer, for example. The imaging system further has a recording medium 159 detachably mounted thereto, such as a semiconductor memory, to and from which imaged data is written and read out and a recording medium control interface 158 usable for writing and reading to and from the recording medium 159. The solid-state imaging system further has a general control/calculation unit 1510 configured to control arithmetic operations and the entire digital still camera, and a timing supply unit 1511 configured to output timing signals to the imaging apparatus 154 and the output signal processing unit 155. Here, timing signals may be input from outside, and the imaging system may have at least the imaging apparatus 154 and the output signal processing unit 155 configured to process an output signal from the imaging apparatus 154.

The output signal processing unit 155 may be a signal processing unit externally provided to imaging apparatus as in the first to third exemplary embodiments.

As described above, the imaging system of this exemplary embodiment applies the imaging apparatus 154 to perform imaging operations.

The aforementioned exemplary embodiments are given only for illustration of concrete implementation examples of the present invention, and it should be understood that the technical scope of the present invention is not to be intended to be interpreted limitedly. In other words, various changes may be made to the present invention without departing from the technical idea or the main characteristics. The aforementioned exemplary embodiments may be combined in various manners.

The present invention can achieve proper balance between the length of a period required for AD conversions and the width of a dynamic range.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-142507, filed Jul. 16, 2015, and Japanese Patent Application No. 2016-041580, filed Mar. 3 2016, which are hereby incorporated by reference herein in their entirety.

What is claimed is:

1. An imaging apparatus comprising pixels configured to output optical signals, an AD converting unit, a reference signal supplying unit configured to supply a ramp signal to the AD converting unit, and a counter configured to generate a count signal by counting clock signals, wherein the AD converting unit performs a first comparison being a comparison between a ramp signal and the optical signal, the ramp signal having a signal level changing in a first amplitude range at a first changing rate depending on elapsed time;

in a case where the magnitude relationship between the ramp signal and the optical signal is changed in the first comparison, the AD converting unit generates a first digital signal by acquiring the count signal corresponding to a change from start of the first comparison to the change of the magnitude relationship between the ramp signal and the optical signal, and generates a second digital signal by performing a second comparison being a comparison between a ramp signal and the optical signal, the ramp signal having a signal level changing in a second amplitude range at a second changing rate depending on elapsed time;

in a case where the magnitude relationship between the ramp signal and the optical signal is not changed in the first comparison, the AD converting unit generates a third digital signal by performing a third comparison being a comparison between a ramp signal and the optical signal, the ramp signal having signal level changing in a third amplitude range larger than the first amplitude range at a third changing rate depending on elapsed time larger than both of the first changing rate and the second changing rate.

2. The imaging apparatus according to claim 1, wherein the first changing rate and the second changing rate are equal.

3. The imaging apparatus according to claim 1, wherein the first amplitude range is equal to $½^N$ of the third amplitude range.

4. The imaging apparatus according to claim 1, wherein the third amplitude range is larger than the second amplitude range.

5. The imaging apparatus according to claim 1, wherein the AD converting unit further generates a fourth digital signal by performing a plurality of fourth comparisons each being a comparison between a noise signal and a ramp signal having a signal level changing in a fourth amplitude range at a fourth changing rate depending on elapsed time; and
the fourth amplitude range is smaller than the first amplitude range.

6. The imaging apparatus according to claim 5, wherein the fourth changing rate is equal to the first changing rate.

7. The imaging apparatus according to claim 1, wherein the counter performs a bit shift on a result of counting of the clock signal to a higher-order bit to generate the count signal for generating the third digital signal, compared with a case where the count signal for generating the second digital signal is generated.

8. The imaging apparatus according to claim 1, wherein the imaging apparatus has an adding unit configured to add the first digital signal and the second digital signal.

9. The imaging apparatus according to claim 8, wherein the count signal is Gray code including a plurality of bits.

10. The imaging apparatus according to claim 1, wherein the plurality of pixels are arranged over a plurality of rows and a plurality of columns;
a first memory group and a second memory group are provided for each of the plurality of columns and hold the count signals;
the first memory group has a bit width of N+1 bits (where N is a natural number) and holds values from a least significant bit to an (N+1)th bit of the count signal acquired by the first comparison; and
the second memory group has a bit width of M bits (where M is a natural number) larger than N+1 bits and holds values from the least significant bit to an Mth bit of the count signal acquired by the second comparison.

11. The imaging apparatus according to claim 10, wherein the count signal output by the counter in the first comparison is (N+1)-bit Gray code; and
the count signal output by the counter in the second comparison is M-bit Gray code.

12. An imaging apparatus comprising pixels each configured to generate an optical signal by performing photoelectric conversion on light and output the optical signal, an AD converting unit, a reference signal supplying unit configured to supply a ramp signal to the AD converting unit, a counter configured to generate a count signal by counting clock signals, and an amplifying unit configured to output to the AD converting unit an amplified signal being a signal acquired by amplifying the optical signal by a predetermined amplification factor,
wherein the AD converting unit performs a first comparison being a comparison between the ramp signal and a first amplified signal having undergone amplification by a first amplification factor in the amplifying unit;
in a case were the magnitude relationship between the ramp signal and the first amplified signal is changed in the first comparison, the AD converting unit generates a first digital signal by acquiring the count signal corresponding to a period from start of the first comparison to the change of the magnitude relationship between the ramp signal and the first amplified signal and generates a second digital signal by performing a second comparison being a comparison between the ramp signal and the first amplified signal; and
in a case where the magnitude relationship between the ramp signal and the first amplified signal is not changed in the first comparison, the AD converting unit generates a third digital signal by performing a third comparison being a comparison between the ramp signal and a second amplified signal having undergone amplification by a second amplification factor smaller than the first amplification factor in the amplifying unit.

13. The imaging apparatus according to claim 12, wherein the amplifying unit further generates a third amplified signal by amplifying a noise signal;
the AD converting unit further generates a fourth digital signal by performing a fourth comparison being a comparison between the third amplified signal and the ramp signal; and
the amplifying unit generates the third amplified signal by amplifying the noise signal by the first amplification factor.

14. The imaging apparatus according to claim 12, wherein the counter performs a bit shift on a result of counting of the clock signal to a higher-order bit to generate the count signal for generating the third digital signal, compared with a case where the count signal for generating the second digital signal is generated.

15. The imaging apparatus according to claim 12, wherein the imaging apparatus has an adding unit configured to add the first digital signal and the second digital signal.

16. The imaging apparatus according to claim 12, wherein the plurality of pixels are arranged over a plurality of rows and a plurality of columns;
a first memory group and a second memory group are provided for each of the plurality of columns and hold the count signals;
the first memory group has a bit width of N+1 bits (where N is a natural number) and holds values from a least significant bit to an (N+1)th bit of the count signal acquired by the first comparison; and
the second memory group has a bit width of M bits (where M is a natural number) larger than N+1 bits and holds values from the least significant bit to an Mth bit of the count signal acquired by the second comparison.

17. The imaging apparatus according to claim 16, wherein
the count signal output by the counter in the first comparison is (N+1)-bit Gray code; and
the count signal output by the counter in the second comparison is M-bit Gray code.

18. An imaging system comprising:
an imaging apparatus; and
a signal processing unit configured to generate an image by processing a signal output from the imaging apparatus, wherein the imaging apparatus has pixels configured to output optical signals, an AD converting unit, a reference signal supplying unit configured to supply a ramp signal to the AD converting unit, and a counter configured to generate a count signal by counting clock signals;
the AD converting unit performs a first comparison being a comparison between a ramp signal and the optical signal, the ramp signal having a signal level changing in a first amplitude range at a first changing rate depending on elapsed time;
in a case where the magnitude relationship between the ramp signal and the optical signal is changed in the first comparison, the AD converting unit generates a first digital signal by acquiring the count signal corresponding to a change from start of the first comparison to the change of the magnitude relationship between the ramp signal and the optical signal, and generates a second digital signal by performing a second comparison being a comparison between a ramp signal and the optical signal, the ramp signal having a signal level changing in a second amplitude range at a second changing rate depending on elapsed time;
in a case where the magnitude relationship between the ramp signal and the optical signal is not changed in the first comparison, the AD converting unit generates a third digital signal by performing a third comparison being a comparison between a ramp signal and the optical signal, the ramp signal having a signal level changing in a third amplitude range larger than the first amplitude range at a third changing rate depending on elapsed time larger than both of the first changing rate and the second changing rate.

19. The imaging system according to claim 18, wherein the imaging apparatus outputs the first digital signal and the second digital signal to the signal processing unit; and
the signal processing unit adds the first digital signal and the second digital signal.

20. An imaging system comprising:
an imaging apparatus; and
a signal processing unit,
wherein the imaging apparatus has
pixels configured to output optical signals, an AD converting unit, a reference signal supplying unit configured to supply a ramp signal to the AD converting unit, and a counter configured to generate a count signal by counting clock signals;
the AD converting unit performs a first comparison being a comparison between a ramp signal and the optical signal, the ramp signal having a signal level changing in a first amplitude range at a first changing rate depending on elapsed time;
in a case where the magnitude relationship between the ramp signal and the optical signal is changed in the first comparison, the AD converting unit generates a first digital signal by acquiring the count signal corresponding to a change from start of the first comparison to the change of the magnitude relationship between the ramp signal and the optical signal, and generates a second digital signal by performing a second comparison being a comparison between a ramp signal and the optical signal, the ramp signal having a signal level changing in a second amplitude range at a second changing rate depending on elapsed time;
in a case where the magnitude relationship between the ramp signal and the optical signal is not changed in the first comparison, the AD converting unit generates a third digital signal by performing a third comparison being a comparison between a ramp signal and the optical signal, the ramp signal having a signal level changing in a third amplitude range larger than the first amplitude range at a third changing rate depending on elapsed time larger than both of the first changing rate and the second changing rate;
the AD converting unit further generates a fourth digital signal by performing a plurality of fourth comparisons each being a comparison between a noise signal and a ramp signal having a signal level changing in a fourth amplitude range at a fourth changing rate depending on elapsed time;
the fourth amplitude range is smaller than the first amplitude range; and
the signal processing unit generates a difference between the first digital signal and the fourth digital signal output from the AD converting unit having performed the second comparison and generates a difference between the second digital signal and the fourth digital signal output from the AD converting unit having performed the third comparison to generate an image.

* * * * *